(12) United States Patent
Twaddell

(10) Patent No.: US 12,035,443 B2
(45) Date of Patent: Jul. 9, 2024

(54) CONTROL DEVICE HAVING A VISIBLE INDICATOR

(71) Applicant: Lutron Technology Company LLC, Coopersburg, PA (US)

(72) Inventor: Daniel L. Twaddell, Bethlehem, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 48 days.

(21) Appl. No.: 17/005,157

(22) Filed: Aug. 27, 2020

(65) Prior Publication Data

US 2021/0068238 A1 Mar. 4, 2021

Related U.S. Application Data

(60) Provisional application No. 62/892,308, filed on Aug. 27, 2019.

(51) Int. Cl.
| | | |
|---|---|---|
| *H05B 45/40* | (2020.01) | |
| *H05B 45/12* | (2020.01) | |
| *H05B 47/19* | (2020.01) | |

(52) U.S. Cl.
CPC ............. *H05B 47/19* (2020.01); *H05B 45/12* (2020.01); *H05B 45/40* (2020.01)

(58) Field of Classification Search
CPC ......... H05B 47/19; H05B 45/40; H05B 45/12
See application file for complete search history.

(56) References Cited

U.S. PATENT DOCUMENTS

| | | | |
|---|---|---|---|
| 5,017,837 A | 5/1991 | Hanna et al. | |
| 5,248,919 A | 9/1993 | Hanna et al. | |
| 5,264,761 A | 11/1993 | Johnson | |
| 5,399,940 A * | 3/1995 | Hanna ................... | H05B 47/185 |
| | | | 315/129 |
| 5,430,356 A * | 7/1995 | Ference ................. | H05B 39/08 |
| | | | 315/307 |
| 7,242,150 B2 | 7/2007 | DeJonge et al. | |
| 7,546,473 B2 | 6/2009 | Newman | |
| 7,592,925 B2 | 9/2009 | Nearhoof et al. | |
| 7,608,948 B2 * | 10/2009 | Nearhoof ............... | H05B 39/04 |
| | | | 307/140 |
| 7,664,881 B2 | 2/2010 | Le Pennec et al. | |
| 7,745,750 B2 * | 6/2010 | Hewson ............... | H01H 3/0213 |
| | | | 200/315 |

(Continued)

FOREIGN PATENT DOCUMENTS

CN 2596671 Y 12/2003

*Primary Examiner* — Henry Luong
(74) *Attorney, Agent, or Firm* — Flaster Greenberg PC

(57) ABSTRACT

A control device configured to control an amount of power delivered to an electrical load may provide feedback regarding the amount of power being delivered to the electrical load. The control device may include a visual indicator that is illuminated by a plurality of light sources. The control device may comprise a control circuit configured to determine the amount of power being delivered to the electrical load and control the light sources to illuminate a portion of the visual indicator to indicate the amount of power being delivered. Different sections of the illuminated portion of the visual indicator may be illuminated to different intensity levels and the intensity levels may be adjusted between different operational states.

23 Claims, 18 Drawing Sheets

(56) References Cited

U.S. PATENT DOCUMENTS

| | | |
|---|---|---|
| 7,791,595 B2 | 9/2010 | Altonen et al. |
| 7,834,856 B2 | 11/2010 | Grinshpoon et al. |
| 7,837,344 B2 | 11/2010 | Altonen et al. |
| 8,330,638 B2 | 12/2012 | Altonen et al. |
| 8,664,881 B2 | 3/2014 | Newman, Jr. et al. |
| 9,208,965 B2 | 12/2015 | Busby et al. |
| 9,418,802 B2 | 8/2016 | Romano et al. |
| 9,520,247 B1 | 12/2016 | Finnegan et al. |
| 9,583,288 B2 | 2/2017 | Jones et al. |
| 9,799,469 B2 | 10/2017 | Bailey et al. |
| 9,959,997 B2 | 5/2018 | Bailey et al. |
| 2003/0019733 A1* | 1/2003 | Sato ............... H01H 9/181 200/310 |
| 2003/0019734 A1 | 1/2003 | Sato et al. |
| 2006/0272569 A1* | 12/2006 | Lehmer ............ H05B 47/155 116/200 |
| 2010/0013649 A1* | 1/2010 | Spira ............... H05B 39/04 315/291 |
| 2011/0162946 A1* | 7/2011 | Altonen ............ H05B 47/10 200/310 |
| 2012/0292174 A1 | 11/2012 | Mah et al. |
| 2015/0077021 A1 | 3/2015 | Smith et al. |
| 2015/0371534 A1 | 12/2015 | Dimberg et al. |
| 2016/0073479 A1 | 3/2016 | Erchak et al. |
| 2017/0017324 A1* | 1/2017 | O'Keeffe ........... G02B 6/0078 |
| 2017/0105176 A1 | 4/2017 | Finnegan et al. |
| 2017/0278383 A1* | 9/2017 | Dimberg ............ H05B 47/19 |
| 2017/0278647 A1 | 9/2017 | Dimberg et al. |
| 2017/0280533 A1* | 9/2017 | Dimberg ............ G06F 3/0488 |
| 2017/0354011 A1 | 12/2017 | Dimberg et al. |
| 2018/0114434 A1 | 4/2018 | Newman, Jr. et al. |
| 2018/0190451 A1 | 7/2018 | Scruggs |

\* cited by examiner

CONTROL DEVICE HAVING A VISIBLE INDICATOR

CROSS-REFERENCE TO RELATED APPLICATIONS

This application claims the benefit of U.S. Provisional Patent Application No. 62/892,308, filed Aug. 27, 2019, the contents of which are incorporated herein by reference in its entirety.

BACKGROUND

A load control system may include one or more electrical loads that a user may wish to control via a single load control device. These electrical loads may include, for example, lighting loads, HVAC units, motorized window treatment or projection screens, humidity control units, audio systems or amplifiers, Internet of Things (IoT) devices, and/or the like. The electrical loads may have advanced features. For example, a lighting load may be controlled to emit light of varying intensities and/or colors in response to a user command. The amount of power delivered to the electrical loads may be adjusted to an absolute level or by a relative amount. Multiple electrical loads may be manipulated such that one or more presets or scenes (e.g., combinations of particular lighting conditions, temperature settings, speaker volume, and/or the like) may be created, and a user may desire the ability to browse through the presets or scenes, and activate one that fits a particular occasion. With a traditional load control device such as a mechanical toggle switch, a user will not able to perform any of the aforementioned functions, let alone performing multiple of them through one device.

The insufficiencies of traditional load control devices arise at least in part from the actuation mechanism utilized in those devices. More specifically, traditional load control devices are typically only capable of responding to simple user actions such as moving a lever or pushing a button. As such, the number and/or types of control that may be applied through a load control device is limited. To meet the demand of advanced electrical loads, there is a need to employ alternative user interface technologies such as those capable of detecting human gestures and translating the gestures into control data (e.g., control signals) for controlling the electrical loads. These technologies may expand the capacity of a load control device, while at the same time enhancing its usability and aesthetic appeal, for example.

A traditional load control device may also lack the capacity to provide visible feedback to a user about the operation of the load control device and/or the electrical loads controlled by the load control devices. Such capacity is an important aspect of user experience in an advanced load control system where a user may be able to manipulate multiple operating parameters of an electrical load or to control multiple electrical loads via a single control device. Provision of feedback in those environments can keep the user informed about the state and/or mode of the control device and electrical loads, and may help the user navigate through the various functionalities of the control device.

SUMMARY

As described herein, a control device configured to control an amount power delivered to an electrical load may comprise a visual indicator capable of being illuminated to provide feedback regarding the amount of power delivered to the electrical load. The visual indicator may be illuminated by a plurality of light sources comprised in the control device and may form a light bar (e.g., a linear or circular light bar) on a front surface of the control device. The control device may further comprise a control circuit configured to determine the amount of power being delivered to the electrical load and control the light sources to illuminate a portion of the visual indicator to indicate the amount of power being delivered. Different sections of the illuminated portion of the visual indicator may be illuminated to different intensity levels. For example, the control circuit may be configured to illuminate a set of adjacent light sources to a maximum intensity level, and to illuminate an end light source next to the adjacent light sources to an intermediate intensity level in dependence upon the feedback to be provided.

The control circuit may be further configured to illuminate the visual indicator in an active state (e.g., when a user is actuating the control device) and an idle state (e.g., the control device is not being actuated). The control circuit may decrease the intensity levels of the illuminated portion of the visual indicator when the control circuit is transitioning from the active state to the idle state.

DETAILED DESCRIPTION

Figure 1:
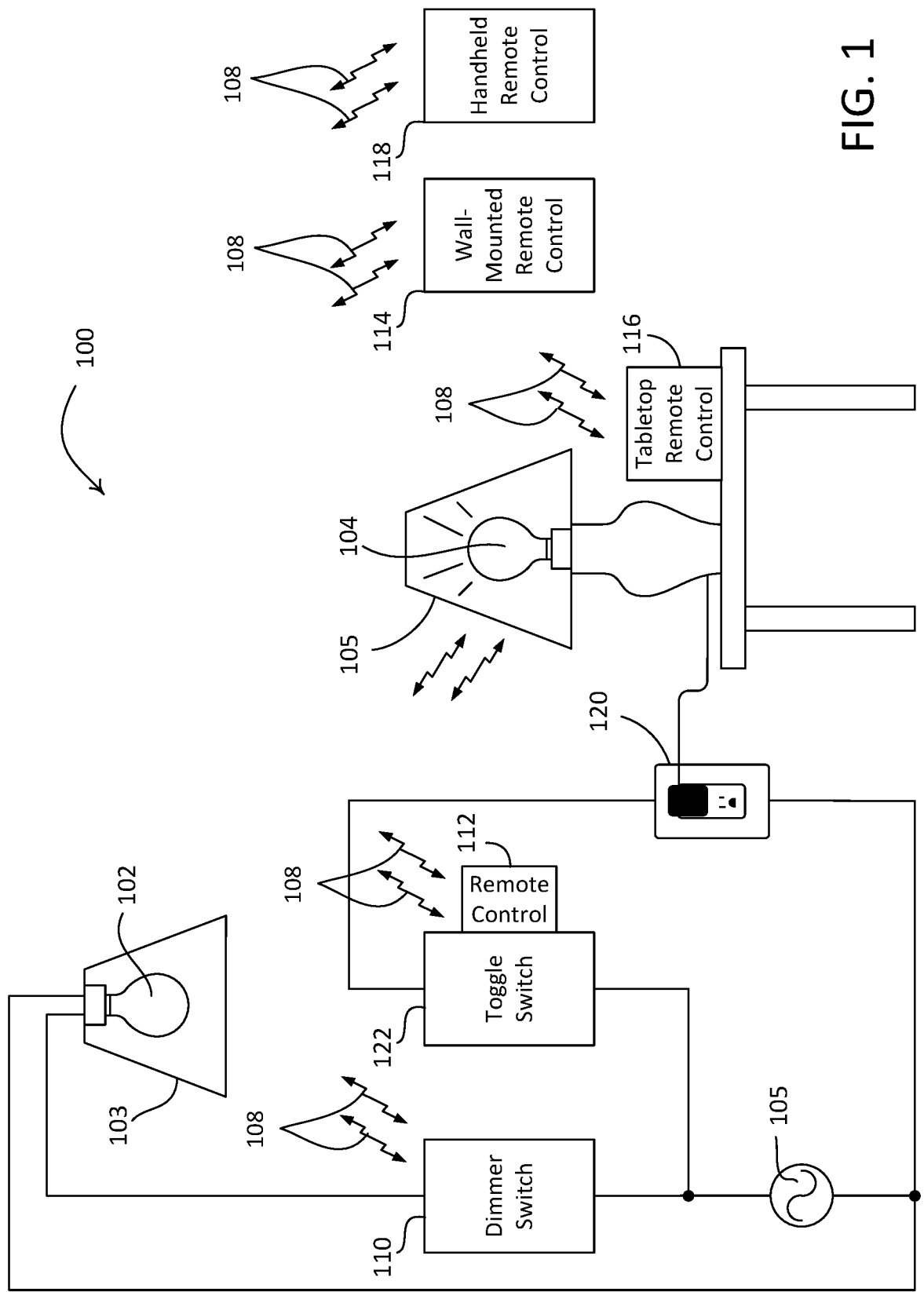
FIG. 1 depicts an example load control system that includes one or more example control devices.

FIG. 1 is a simplified block diagram of an example load control system. As shown, the load control system is configured as a lighting control system 100 for control of one or more lighting loads, such as a lighting load 102 that is installed in a ceiling-mounted downlight fixture 103 and a controllable lighting load 104 that is installed in a table lamp 105. The lighting loads 102, 104 shown in FIG. 1 may include light sources of different types (e.g., incandescent lamps, fluorescent lamps, and/or LED light sources). The lighting loads may have advanced features. For example, the lighting loads may be controlled to emit light of varying intensities and/or colors in response to a user command. The amount of power delivered to the lighting loads may be adjusted to an absolute level or by a relative amount. The lighting control system 100 may be configured to control one or more of the lighting loads and/or other electrical loads according to one or more configurable presets or scenes. These presets or scenes may correspond to, for example, predefined light intensities and/or colors, predefined entertainment settings such as music selection and/or volume settings, predefined window treatment settings such as positions of shades, predefined environmental settings such as HVAC settings, or any combination thereof. The presets or scenes may correspond to one or more specific electrical loads (e.g., bedside lamps, ceiling lights, etc.) and/or one or more specific locations (e.g., a room, an entire house, etc.).

The lighting load 102 may be an example of a lighting load that is wired into a power control and/or delivery path of the lighting control system 100. As such, the lighting load 102 may be controllable by a wall-mounted control device such as a dimmer switch. The lighting load 104 may be an example of a lighting load that is equipped with integral load control circuitry and/or wireless communication capabilities such that the lighting load may be controlled via a wireless control mechanism (e.g., by a remote control device).

The lighting control system 100 may include one or more control devices for controlling the lighting loads 102, 104 (e.g., controlling an amount of power delivered to the lighting loads). The lighting loads 102, 104 may be controlled substantially in unison, or be controlled individually. For example, the lighting loads may be zoned so that the lighting load 102 may be controlled by a first control device, while the lighting load 104 may be controlled by a second control device. The control devices may be configured to turn the lighting loads 102, 104 on and off. The control devices may be configured to control the magnitude of a load current conducted through the lighting loads, e.g., so as to control an intensity level (e.g., a brightness) of the lighting loads 102, 104 between a low-end intensity level $L_{LE}$ and a high-end intensity level $L_{HE}$. The control devices may be configured to control an amount of power delivered to the lighting loads to an absolute level (e.g., to a maximum allowable amount), or by a relative amount (e.g., an increase of 10% from a current level). The control devices may be configured to control a color of the lighting load 102, 104 (e.g., by controlling a color temperature of the lighting loads or by applying full color control over the lighting loads).

The control devices may be configured to activate a preset associated with the lighting load 102, 104 (e.g., a preset may be associated with one or more predetermined settings of the lighting loads such as an intensity level of the lighting loads and/or a color of the lighting loads). The presets may be configured via the control device and/or via an external device (e.g., a mobile device) by way of a wireless communication circuit of the control device. The control devices may be configured to activate control of a zone. A zone may correspond to one or more electrical loads that are configured to be controlled by the control devices. A zone may be associated with a specific location (e.g., a living room) or multiple locations (e.g., an entire house with multiple rooms and hallways). The control devices may be configured to switch between different operational modes. An operational mode may be associated with controlling different types of electrical loads or different operational aspects of one or more electrical loads. Examples of operational modes may include a lighting control mode for controlling one or more lighting loads (e.g., which in turn may include a color control mode and an intensity control mode), an entertainment system control mode (e.g., for controlling music selection and/or the volume of an audio system), an HVAC system control mode, a window treatment device control mode (e.g., for controlling one or more shades), and/or the like.

The control device described herein may be, for example, a dimmer switch 110, a retrofit remote control device 112, a wall-mounted control device 114, a tabletop remote control device 116, and/or a handheld remote control device 118, as shown in FIG. 1. The dimmer switch 110 may be configured to be mounted to a standard electrical wallbox (e.g., via a yoke) and be coupled in series electrical connection between an alternating-current (AC) power source 105 and a lighting load that is wired into the control path of the dimmer switch 110 (e.g., such as the lighting load 102). The dimmer switch 110 may receive an AC mains line voltage $V_{AC}$ from the AC power source 105, and may generate a control signal for controlling the lighting load 102. The control signal may be generated via various phase-control techniques (e.g., a forward phase-control dimming technique or a reverse phase-control dimming technique). The dimmer switch 110 may be configured to receive wireless signals (e.g., from a remote control device) representative of commands to control the lighting load 102, and generate respective control signals for executing the commands. Examples of wall-mounted dimmer switches are described in greater detail in commonly-assigned U.S. Pat. No. 7,242,150, issued Jul. 10, 2007, entitled DIMMER HAVING A POWER SUPPLY MONITORING CIRCUIT; U.S. Pat. No. 7,546,473, issued Jun. 9, 2009, entitled DIMMER HAVING A MICROPROCESSOR-CONTROLLED POWER SUPPLY; and U.S. Pat. No. 8,664,881, issued Mar. 4, 2014, entitled TWO-WIRE DIMMER SWITCH FOR LOW-POWER LOADS, the entire disclosures of which are hereby incorporated by reference.

The retrofit remote control device 112 may be configured to be mounted to a mechanical switch (e.g., a toggle switch 122) that may be pre-existing in the lighting control system 100. Such a retrofit solution may provide energy savings and/or advanced control features, for example without requiring significant electrical re-wiring and/or without requiring the replacement of existing mechanical switches. As an example, a consumer may replace an existing lamp with the controllable lighting load 104, switch a toggle switch 122 that is coupled to the lighting load 104 to the on position, install (e.g., mount) the remote control device 112 onto the toggle switch 122, and associate the remote control device 112 with the lighting source 104. The retrofit remoted control 112 may then be used to perform advanced functions that the toggle switch 122 may be incapable of performing (e.g., such as dimming the intensity level of the light output, changing the color of the light output, providing feedback to a user, etc.). As shown, the toggle switch 122 is coupled (e.g., via a series electrical connection) between the AC power source 105 and an electrical receptacle 120 into which the lighting load 104 may be plugged (e.g., as shown in FIG. 1). Alternative, the toggle switch 122 may be coupled between the AC power source 105 and one or more of the lighting loads 102, 104, without the electrical receptacle 120.

The wall-mounted remote control device 114 may be configured to be mounted to a standard electrical wallbox and be electrically connected to the AC power source 105 for receiving power. The wall-mounted remote control device 114 may be configured to receive a user input and may generate and transmit a control signal (e.g., control data such as a digital message) for controlling the lighting loads 102, 104 in response to the user input. The tabletop remote control device 116 may be configured to be placed on a surface (e.g., an end table or night stand), and may be powered by a direct-current (DC) power source (e.g., a battery or an external DC power supply plugged into an electrical outlet). The tabletop remote control device 116 may be configured to receive a user input, and may generate and transmit a signal (e.g., a digital message) for controlling the lighting loads 102, 104 in response to the user input. The handheld remote control device 118 may be sized to fit into a user's hand, and may be powered by a direct-current (DC) power source (e.g., a battery or an external DC power supply plugged into an electrical outlet). The handheld remote control device 118 may be configured to receive a user input, and may generate and transmit a signal (e.g., a digital message) for controlling the lighting loads 102, 104 in response to the user input. Examples of battery-powered remote controls are described in greater detail in commonly assigned U.S. Pat. No. 8,330,638, issued Dec. 11, 2012, entitled WIRELESS BATTERY POWERED REMOTE CONTROL HAVING MULTIPLE MOUNTING MEANS, and U.S. Pat. No. 7,573,208, issued Aug. 11, 2009, entitled METHOD OF PROGRAMMING A LIGHTING PRESET FROM A RADIO-FREQUENCY REMOTE CONTROL, the entire disclosures of which are hereby incorporated by reference.

It should be appreciated that, although a lighting control system with two lighting loads is provided as an example above, a load control system as described herein may include more or fewer lighting loads, other types of lighting loads, and/or other types of electrical loads that may be configured to be controlled by the one or more control devices. For example, the load control system may include one or more of: a dimming ballast for driving a gas-discharge lamp; an LED driver for driving an LED light source; a dimming circuit for controlling the intensity level of a lighting load; a screw-in luminaire including a dimmer circuit and an incandescent or halogen lamp; a screw-in luminaire including a ballast and a compact fluorescent lamp; a screw-in luminaire including an LED driver and an LED light source; an electronic switch, controllable circuit breaker, or other switching device for turning an appliance on and off; a plug-in control device, controllable electrical receptacle, or controllable power strip for controlling one or more plug-in loads; a motor control unit for controlling a motor load, such as a ceiling fan or an exhaust fan; a drive unit for controlling a motorized window treatment or a projection screen; one or more motorized interior and/or exterior shutters; a thermostat for a heating and/or cooling system; a temperature control device for controlling a set-point temperature of a heating, ventilation, and air-conditioning (HVAC) system; an air conditioner; a compressor; an electric baseboard heater controller; a controllable damper; a variable air volume controller; a fresh air intake controller; a ventilation controller; one or more hydraulic valves for use in radiators and radiant heating system; a humidity control unit; a humidifier; a dehumidifier; a water heater; a boiler controller; a pool pump; a refrigerator; a freezer; a television and/or computer monitor; a video camera; an audio system or amplifier; an elevator; a power supply; a generator; an electric charger, such as an electric vehicle charger; an alternative energy controller; and/or the like.

Figure 2:
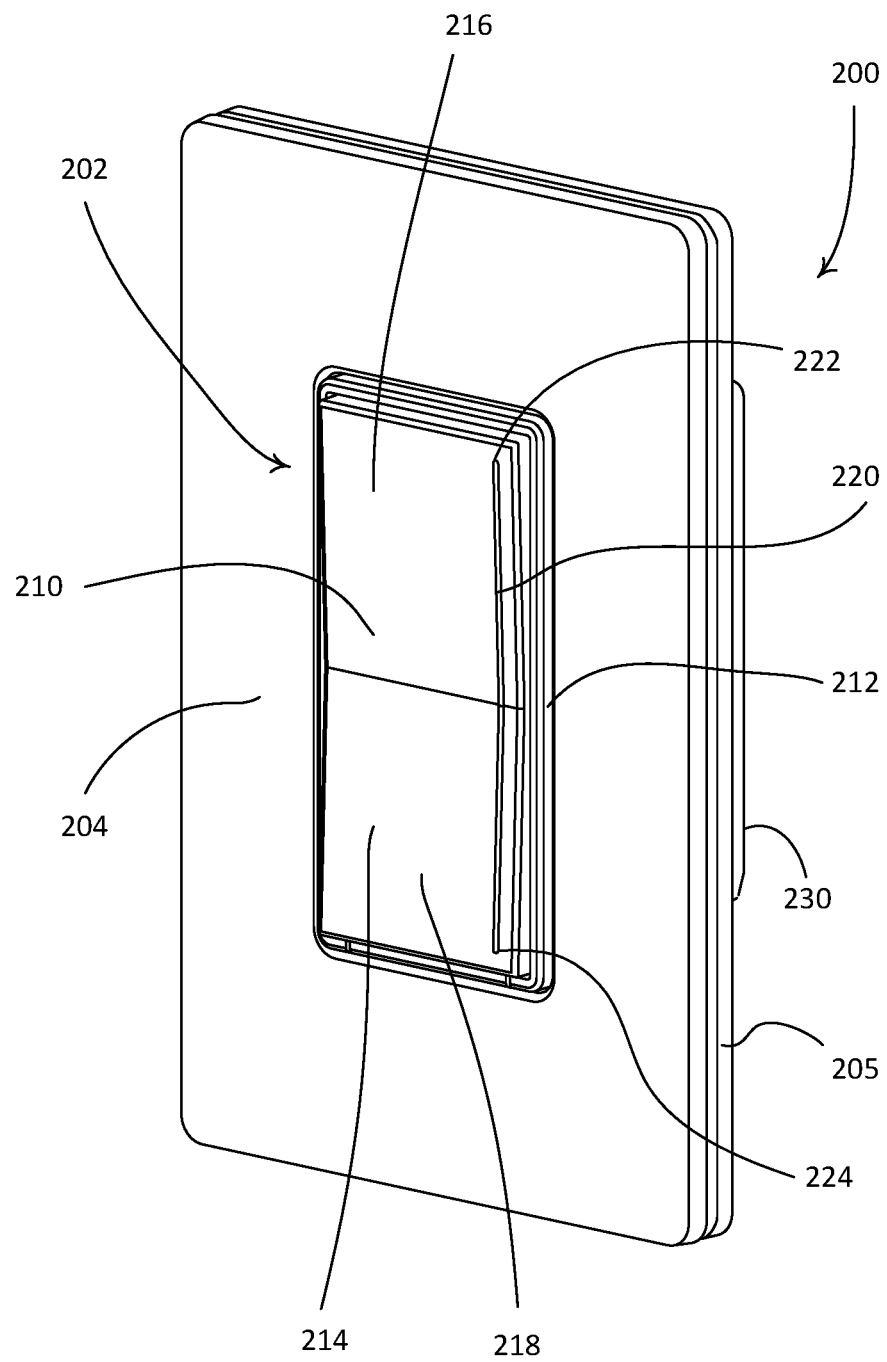
FIG. 2 is a perspective view of an example control device that may be deployed as a dimmer switch and/or a remote control device of the load control system illustrated in FIG. 1.
Figure 3:
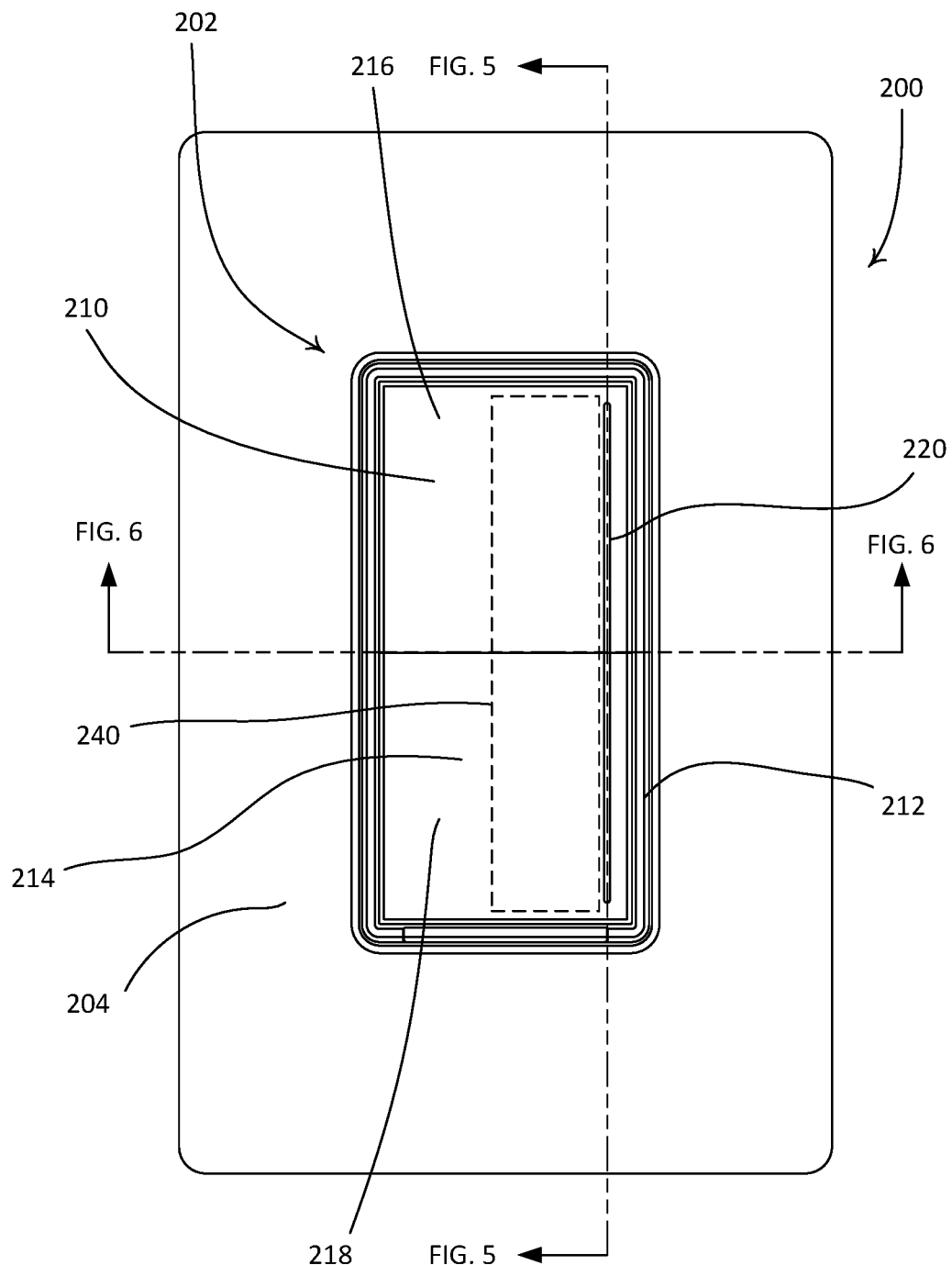
FIG. 3 is a front view of the control device of FIG. 2.

FIG. 2 is a perspective view and FIG. 3 is a front view of an example control device 200 that may be deployed as, for example, the dimmer switch 110 in the lighting control system 100. The control device 200 may comprise a user interface 202 and a faceplate 204. The faceplate 204 may be connected to an adapter 205 that may be mounted to the control device 200. The user interface 202 of the control device 200 may include an actuation member 210 (e.g., an actuation portion) that is configured to be mounted to a base portion 212 (e.g., a bezel). The actuation member 210 may comprise a front surface 214 comprising an upper portion 216 and a lower portion 218. The actuation member 210 may be configured to pivot (e.g., about a central axis) in response to an actuation of the upper portion 216 or the lower portion 218. The control device 200 may be configured to control a lighting load of the lighting control system 100 to turn the lighting load on in response to an actuation of the upper portion 216 and to lighting turn the load off in response to an actuation of the lower portion 218.

At least a portion of the front surface 214 of the actuation member 210 may also be configured as a touch sensitive surface (e.g., a capacitive touch surface) that is configured to receive (e.g., detect) inputs, such as gestures, from a user of the control device 200. The user interface 202 may include a light bar 220 configured to be illuminated by one or more light sources (e.g., one or more LEDs) to visibly display information. For example, the light bar 220 may comprise an elongated continuous light bar extending from a top end 222 to a bottom end 224 as shown in FIG. 2. The front surface 214 of the actuation member 210 may be actuated along the light bar 220 to adjust the amount of power delivered to the lighting load according to the position of the actuation. In examples (e.g., when the control device 200 is a wall-mounted dimmer switch), the control device 200 may comprise a rear enclosure 230 for housing load control circuitry of the dimmer switch. Examples of control devices having capacitive touch surfaces are described in greater detail in commonly-assigned U.S. Patent Application Publication No. 2017/0280533, published Sep. 28, 2017, entitled GESTURE-BASED CONTROL DEVICE FOR CONTROLLING AN ELECTRICAL LOAD, the entire disclosure of which is hereby incorporated by reference.

Figure 4C:
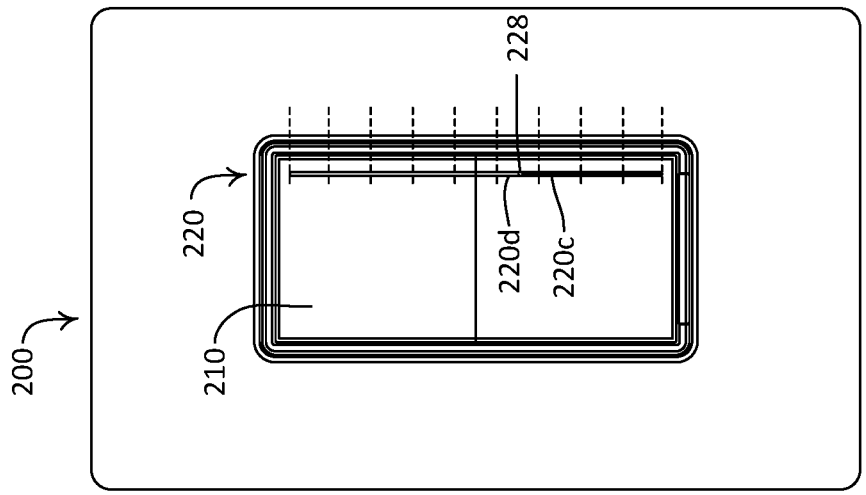
FIGS. 4A-4C are front views of the control device of FIG. 2 illustrating various illumination levels of a light bar.
Figure 4B:
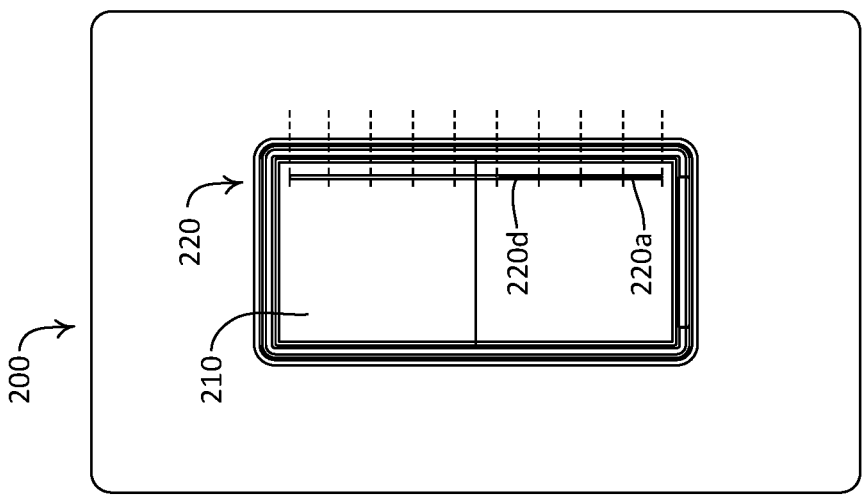
Figure 4A:
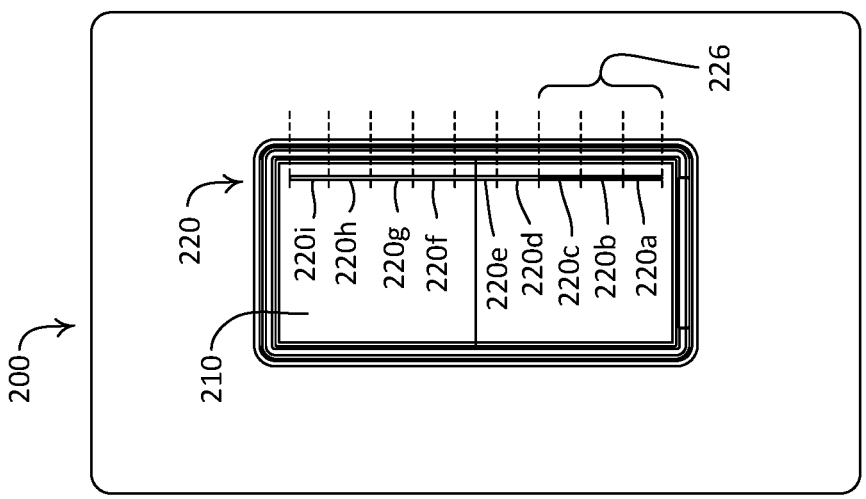

The light bar 220 may be illuminated to indicate a value of a control parameter, such as, for example, an intensity level of one or more lighting devices (e.g., the lighting loads 102, 104). The control device 200 may illuminate a portion of the light bar 220 that corresponds to the intensity level of the one or more lighting devices (e.g., a portion extending from the bottom of the light bar 220). For example, if the intensity level of the one or more the lighting devices is 50%, the control device 200 may illuminate half of the light bar (e.g., the lower half). FIGS. 4A-4C are front views of the control device 200 illustrating the light bar illuminated to indicate various intensity levels (e.g., as will be described in greater detail below).

Figure 5:
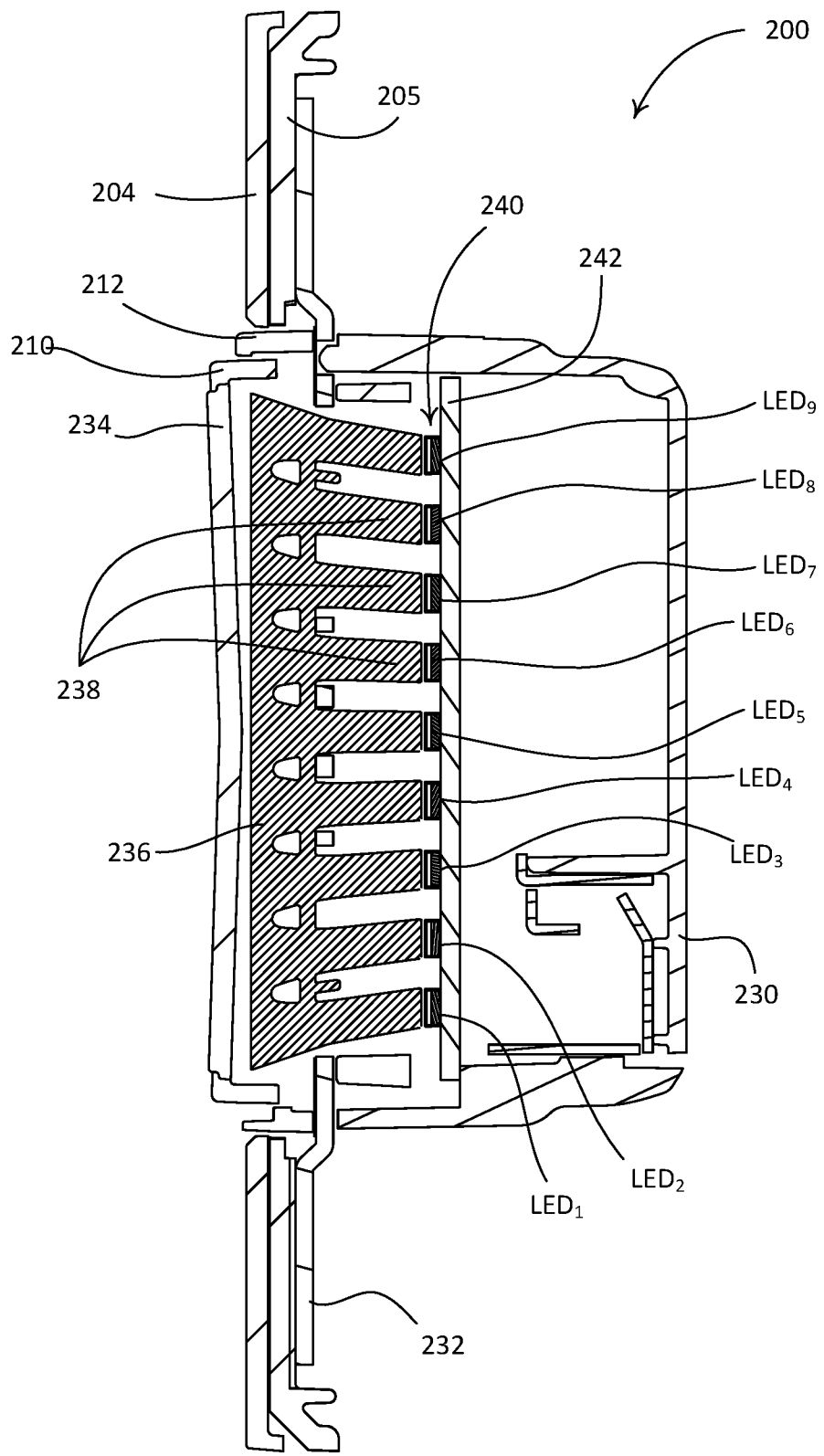
FIG. 5 is a right side cross-sectional view of the control device of FIG. 2.
Figure 6:
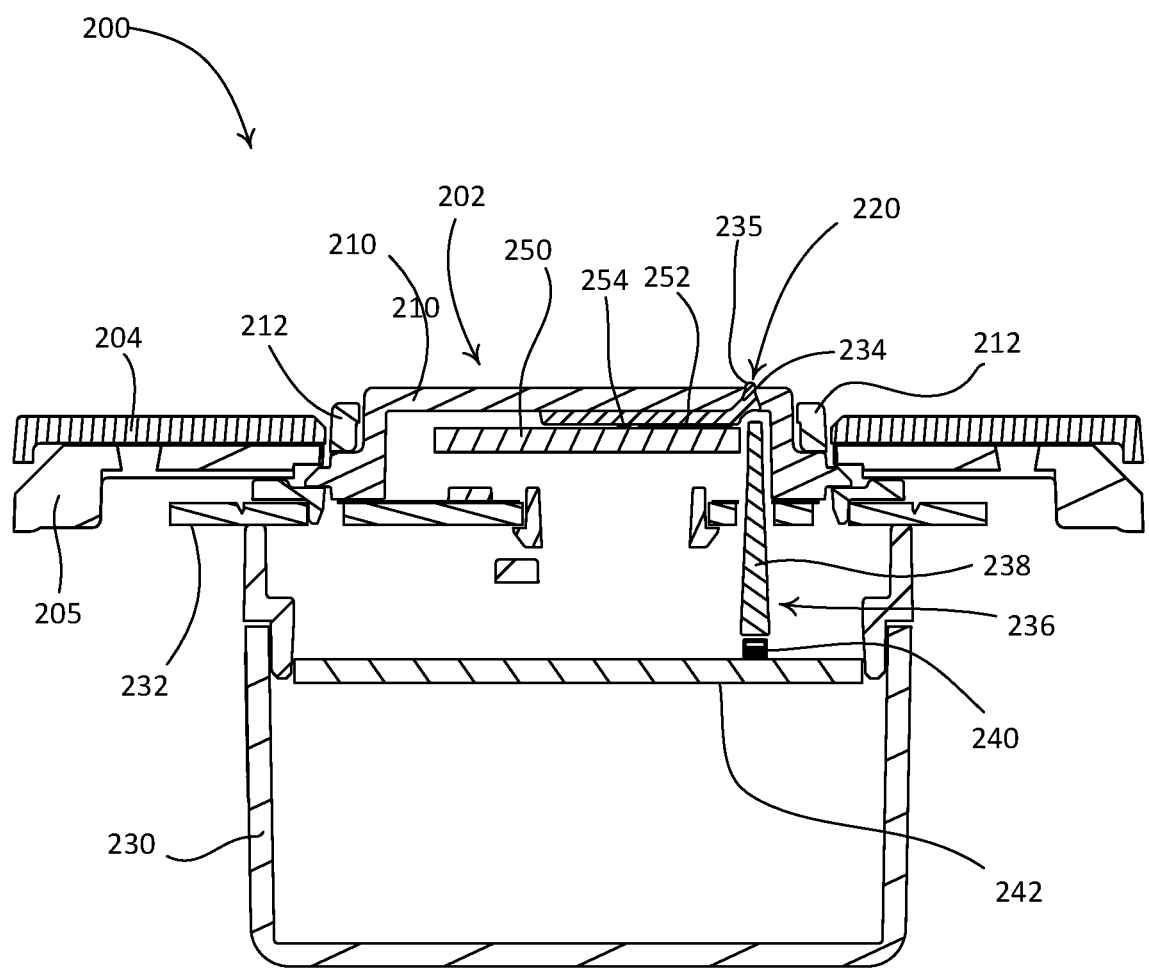
FIG. 6 is a bottom cross-sectional view of the control device of FIG. 2.

FIG. 5 is a right side cross-sectional view of the control device 200 taken through the center of the light bar 220 (e.g., through the line shown in FIG. 3). FIG. 6 is a bottom cross-sectional view of the control device 200 taken through the center of the control device (e.g., through the line shown in FIG. 3). In examples (e.g., when the control device 200 is a wall-mounted dimmer switch), the control device 200 may comprise a yoke 232 that may be connected to the rear enclosure 230 and may be configured to mount the control device to an electrical wallbox.

The control device 200 may comprise a diffuser 234 including a protruding portion 235 that extends through an elongated opening in the actuation member 210 to form the light bar 220. The control device 200 may also comprise a light pipe 236 including a plurality of legs 238 configured to conduct light from one or more respective light sources, e.g., a number $N_{LED-TOTAL}$ of light-emitting diodes (LEDs) 240 located inside of the rear enclosure 230, to the light bar 220. The LEDs 240 may be mounted to a main printed circuit board (PCB) 242 housed in the rear enclosure 230. The LEDs 240 may be arranged in a linear array below the light pipe 236 and the light bar 220. For example, as shown in FIG. 5, the LEDs 240 may comprise nine LEDs labeled $LED_1$ (e.g., at the bottom of the main PCB 242) through $LED_9$ (e.g., at the top of the main PCB 242). There may be, for example, one LED 240 located adjacent to each leg 238 of the light pipe 236. For example, the LEDs 240 may comprise front-firing LEDs. Each LED 240 may be configured to shine light on a respective one of the legs 238 of the light pipe 236, such that each LED 240 may be configured to illuminate a respective segment 220a-220i (e.g., as shown in FIG. 4A) when controlled to a maximum intensity level $L_{MAX}$ (e.g., 100%). For examples, the segments 220a-220i may be approximately equal in length. The diffuser 234 may comprise (e.g., be made of) a diffusive material, and may operate to scatter the light received from that light pipe 236 at the light bar 220.

The main PCB 242 may comprise additional circuitry, such as a load control circuit (not shown) for controlling the lighting load controlled by the control device 200, mounted thereto. A control circuit (not shown) for controlling the load control circuit and/or the LEDs 240 may be mounted to the main PCB 242. The control circuit may be configured to control the LEDs 240 to provide an indication of an intensity level $L_{LOAD}$ (e.g., a present or target lighting intensity level) of the lighting load. For example, the control circuit may be configured to control the LEDs 240 to illuminate a portion 226 of the light bar 220 extending from the bottom of the light bar to indicate the intensity level $L_{LOAD}$ of the lighting load (e.g., as shown in FIG. 4A). The control circuit may be configured to illuminate a number $N_{LED-ON}$ of adjacent LEDs 240 (e.g., starting with LEDs) so that the portion of the light bar 220 may be illuminated, for example, to indicate the intensity level $L_{LOAD}$ of the lighting load. The number $N_{LED-ON}$ of LEDs being illuminated may comprise all of the LEDs 240 or a subset of the LEDs 240. For example, each segment 220a-220i of the light bar 220 may represent a portion $L_{SEG}$ (e.g., an equal portion) of the intensity level $L_{LOAD}$ of the lighting load depending upon the number $N_{LED-TOTAL}$ of LEDs 240 included in the control device 200, e.g., $L_{SEG}=100\%/N_{LED-TOTAL}$. For example, when the number $N_{LED-TOTAL}$ of LEDs 240 included in the control device 200 is nine, the portion $L_{SEG}$ of the intensity level $L_{LOAD}$ of the lighting load indicated by each LED 240 (e.g., when controlled to the maximum intensity level $L_{MAX}$) may be approximately one-ninth of the dimming range of the control device or approximately 11.11%. When the intensity level $L_{LOAD}$ of the lighting load is approximately 33.33%, the control circuit may turn on $LED_1$ through $LED_3$ to the maximum intensity level $L_{MAX}$ to illuminate (e.g., fully illuminate) the first three segments 220a-220c of the light bar 220 as shown in FIG. 4A. When the intensity level $L_{LOAD}$ of the lighting load is approximately 44.44%, the control circuit may turn on $LED_1$ through $LED_4$ to the maximum intensity level $L_{MAX}$ to illuminate (e.g., fully illuminate) the first four segments 220a-220d of the light bar 220 as shown in FIG. 4B.

Some of the number $N_{LED-ON}$ of LEDs that are on may be illuminated to different intensity levels. The control circuit may be configured to illuminate a number $N_{LED-ON-MAX}$ of the LEDs 240 to the maximum intensity level $L_{MAX}$ (e.g., 100%). For example, the number $N_{LED-ON-MAX}$ of the LEDs 240 that are illuminated to the maximum intensity level may be equal to or less than the number $N_{LED-ON}$ of LEDs that are on. The control circuit may be configured to illuminate an intermediate LED (e.g., the last or final LED in the number $N_{LED-ON}$ of adjacent LEDs that are on) to an intermediate intensity level $L_{IM}$, which may range between a minimum intensity level $L_{MIN}$ (e.g., 0%) and the maximum intensity level $L_{MAX}$ (e.g., 100%). The intermediate LED may be located between the LEDs that are on at the maximum intensity level $L_{MAX}$ and the LEDs that are off. For example, the control circuit may be configured to pulse-width modulate (PWM) a voltage applied to the intermediate LED to adjust the intensity level of the intermediate LED to the intermediate intensity level $L_{IM}$. Since the diffuser 234 operates to scatter the light at the light bar 220, the control circuit may be configured to adjust the location of an endpoint 228 of the illuminated portion of the light bar 220 (e.g., as shown in FIG. 4C) by adjusting the intensity of intermediate LED. For example, if the intensity level $L_{LOAD}$ of the lighting load is 40% (e.g., between the intensity levels indicated in FIGS. 4A and 4B), the control circuit may turn on the first three LEDs 240 (e.g., $LED_1$-$LED_3$) to the maximum intensity level $L_{MAX}$ and control the intermediate intensity level $L_{IM}$ of the fourth LED (e.g., $LED_4$) to a value between the minimum intensity level $L_{MIN}$ and the maximum intensity level $L_{MAX}$. For example, the control circuit may determine the intermediate intensity level $L_{IM}$ of the fourth LED to be approximately 60% (e.g., as will be described in greater detail below).

In addition, the control circuit may determine that a number $N_{DIM}$ of the LEDs 240 should be illuminated to the intermediate lighting level $L_{IM}$. The control circuit may illuminate the first $N_{LED-ON-MAX}$ LEDs to a first intensity level (e.g., the maximum intensity level $L_{MAX}$) and illuminate the next $N_{DIM}$ LEDs to the intermediate intensity level $L_{IM}$. The control circuit may be configured to pulse-width modulate (PWM) a voltage applied to the final $N_{DIM}$ LEDs (e.g., intermediate LED(s)) to adjust the intensity level of the final $N_{DIM}$ LEDs to the intermediate intensity level $L_{IM}$. For example, if the intensity level $L_{LOAD}$ of the lighting load is 50%, the control circuit may turn on the first four LEDs 240 (e.g., $LED_1$-$LED_4$) to the maximum intensity level $L_{MAX}$ and control the fifth LED (e.g., $LED_5$) to an intermediate intensity level $L_{IM}$ of 50%.

Since the control device 200 comprises the diffuser 234 and the control circuit is configured to control the intermediate LED to the intermediate intensity level $L_{IM}$, the control device 200 may control the light bar 220 to provide continuous illumination on the light bar 220, for example, despite the use of a limited number of LEDs. The light bar 220 may enhance not only the esthetic appeal of the control device 200 but also the functionality of the control device. For example, feedback indications may be provided with a finer granularity than if the LEDs 240 are controlled to only the maximum intensity level to illuminate the segments 220a-220i individually. The reduction in the number of LEDs may lead to reduced costs and/or simplified circuit design (e.g., which may be desirable considering the spatial constraints associated with the control device 200 and/or the main PCB 242).

The control device 200 may comprise a capacitive touch printed circuit board (PCB) 250. The capacitive touch PCB 250 may be located behind the actuation member 210 for detecting actuations of the front surface 214 of the actuation member 210 and/or gestures of a user of the control device 200. The capacitive touch PCB 250 may be located adjacent to the light bar 220 for detecting actuations of the light bar 220 (e.g., and/or actuations of the front surface 214 of the actuation member 210 adjacent to the light bar 220) as shown by the dashed line in FIG. 3. In examples (e.g., when the light pipe 234 extends from the LEDs in the rear enclosure to the light bar 220 as shown in the example of FIGS. 5 and 6), the capacitive touch PCB 250 may not be located immediately behind the light bar 220. The capacitive touch PCB 250 may comprise one or more receiving capacitive touch pads 252 for detecting the actuations or gesture on or adjacent to the light bar 220. In addition, the LEDs 240 could be mounted to the capacitive touch PCB 250 (e.g., rather than the main PCB 242). When mounted to the capacitive touch PCB 250, the LEDs 240 may comprise side-firing LEDs. In addition, the control device 200 may further comprise a light guide (not shown) for conducting the light to the diffuser 234, and the capacitive touch PCB 250 may be located behind (e.g., immediately behind) the light bar 220.

The control circuit of the control device 200 may be configured to detect the position of the actuation along the length of the light bar 220 in response to input received from the one or more receiving capacitive touch pads 252 and to control the electrical loads according to the determined position. The control circuit may be configured to determine the intensity level $L_{LOAD}$ to which to control the lighting load in response to the position of the actuation along the length of the light bar 220.

When a user is touching the light bar 220, the control circuit may be configured to illuminate the LEDs 240 in an active state in which the light bar 220 (e.g., a portion of the light bar 220 corresponding to the intensity level $L_{LOAD}$ of the lighting load) is illuminated brightly to indicate the intensity level $L_{LOAD}$ of the lighting load. For example, in the active state, the control circuit may illuminate a series of LEDs that correspond to the intensity level $L_{LOAD}$ of the lighting load. The control circuit may further illuminate most (e.g., all but one) of the LEDs in the series of illuminated LEDs to the maximum intensity level $L_{MAX}$ (e.g., 100%) and illuminate one or more intermediate LEDs in the series of illuminated LEDs to the intermediate intensity level $L_{IM}$. When the light bar 220 is the active state, the user may slide a finger up and down the light bar 220 to adjust (e.g., continuously adjust) the intensity level $L_{LOAD}$ of the lighting load. The control circuit may be configured to update the light bar 220 to indicate the intensity level $L_{LOAD}$ of the lighting load as the finger of the user slides up and down the light bar.

After the user stops touching the light bar 220, the control circuit may be configured to transition the LEDs 240 to an idle state in which the light bar 220 (e.g., the portion of the light bar 220 corresponding to the intensity level $L_{LOAD}$ of the lighting load) is illuminated dimly while still indicating the intensity level $L_{LOAD}$ of the lighting load. For example, in the idle state, the control circuit may illuminate most (e.g., all but one) of the LEDs in the series of illuminated LEDs to an idle state intensity level $L_{IDLE}$ (e.g., 20%) and illuminate the one or more intermediate LEDs in the series of illuminated LEDs to the intermediate intensity level $L_{IM}$. The control circuit may adjust the intermediate intensity level $L_{IM}$ (e.g., increase the intermediate intensity level $L_{IM}$) of the one or more intermediate LEDs as the control circuit transitions the light bar 220 from the active state to the idle state to ensure that the light bar 220 keeps indicating the intensity level $L_{LOAD}$ of the lighting load (e.g., to compensate for the decrease in the overall intensity level of the light bar 220 as will be described in greater detail below).

Figure 7:
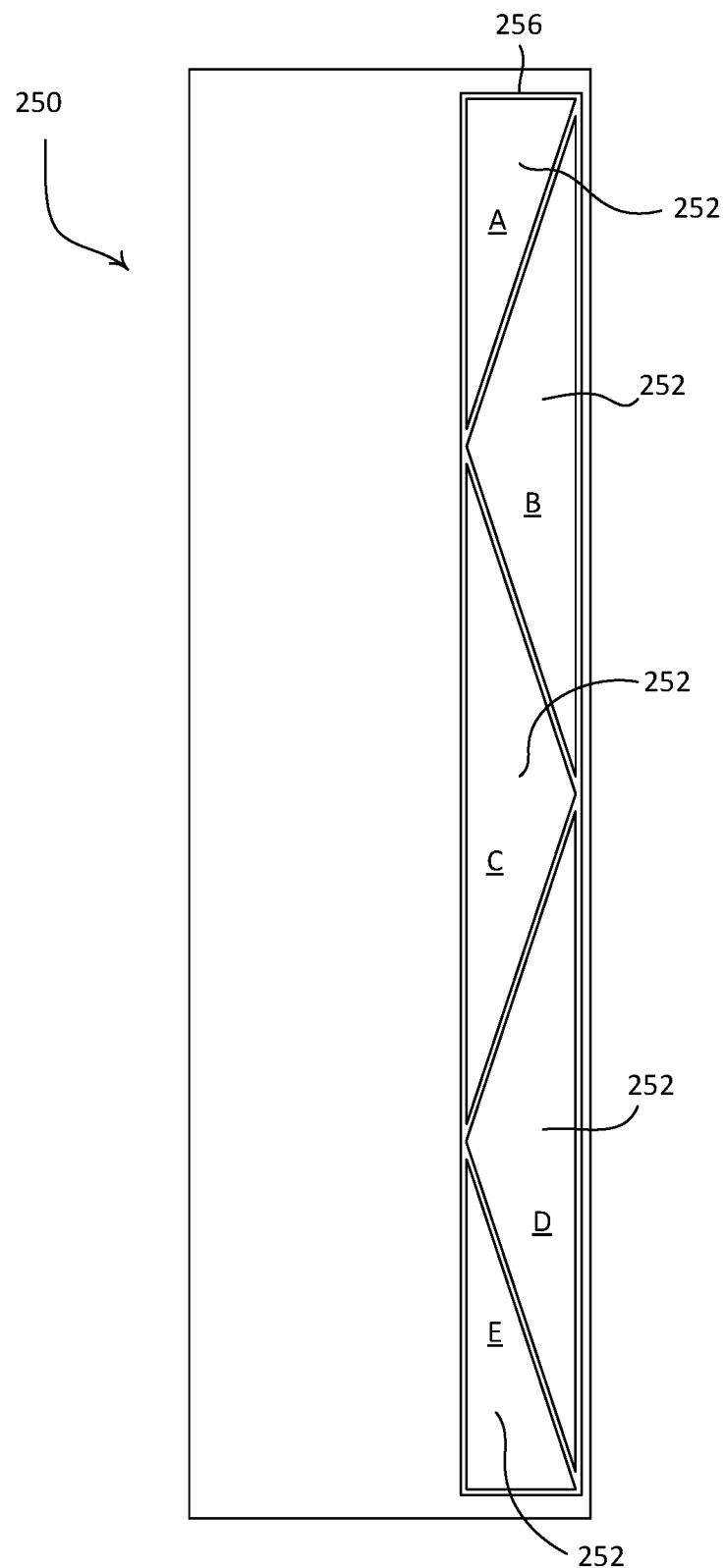
FIG. 7 is a front view of a capacitive touch printed circuit board of the control device of FIG. 2
Figure 8:
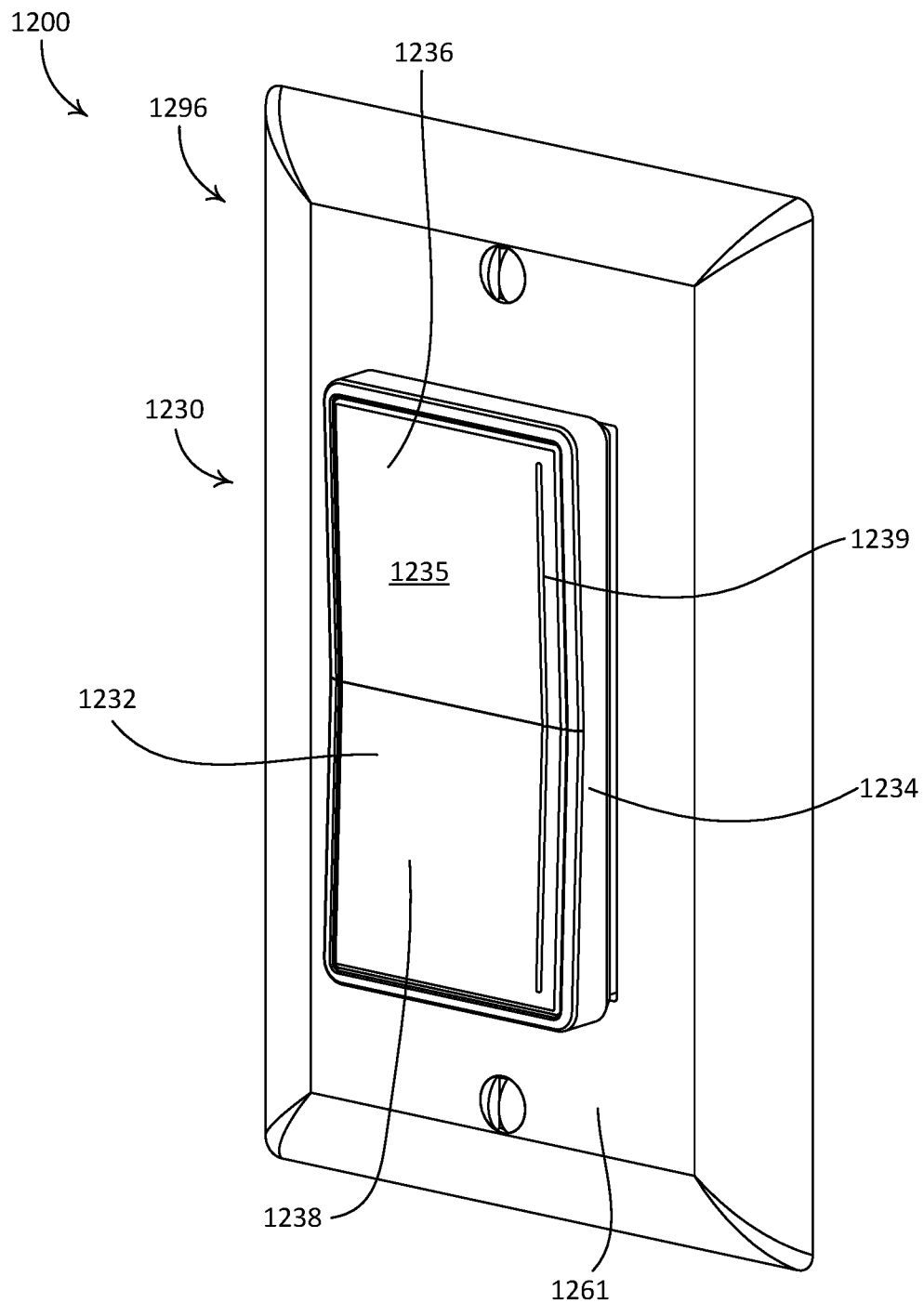
FIGS. 8-13 depict another example of a remote control device that may be installed in a load control system, such as the load control system illustrated in FIG. 1.
Figure 10:
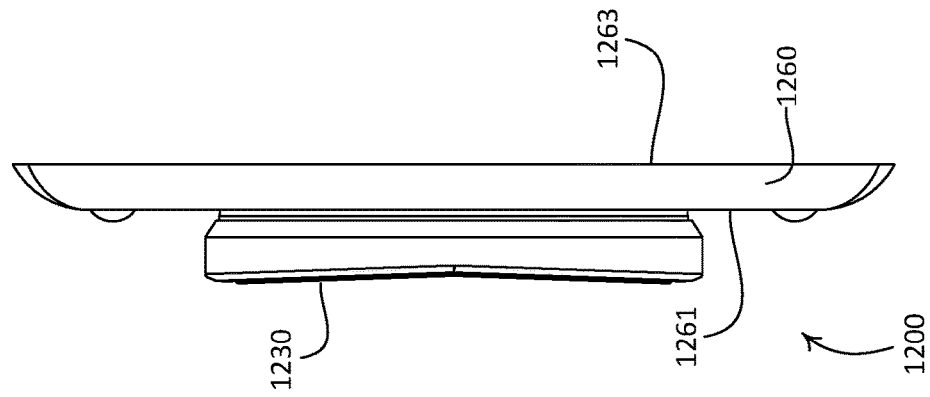

FIG. 7 is a front view of the capacitive touch PCB 250. The capacitive touch PCB 250 may comprise one or more (e.g., five) receiving capacitive touch pads 252 (e.g., capacitive touch regions A-E) as shown in FIG. 7. The receiving capacitive touch pads 252 may be triangular in shape (other shapes are also possible) and/or may be arranged in a linear array that extends from the top to the bottom of the capacitive touch PCB 250 (e.g., on the right side of the capacitive touch PCB 250). For example, regions A and/or E of the receiving capacitive touch pads 252 may be electrically coupled together. The linear array of the receiving capacitive touch pads 252 may extend along a longitudinal axis of the control device 200. Although illustrated as including five triangularly shaped capacitive touch pads 252, in other examples the capacitive touch PCB 250 may include any number and/or the shape of the capacitive touch pads 252. The receiving capacitive touch pads 252 may be configured according to a mutual capacitance sensing technique. The receiving capacitive touch pads 252 may be surrounded by a transmission trace 256. The control device 200 may be configured to energize the transmission trace 256 to charge the receiving capacitive touch pads 252, which may reduce the influence of other objects in the environment of the control device 200 from affecting the capacitive touch sensing.

FIGS. 8-13 depict another example of a remote control device 1200 that may be installed in a load control system, such as the load control system of FIG. 1. The load control system may include a mechanical switch 1290 that may be in place prior to installation of the remote control device 1200, for example pre-existing in the load control system. As shown, the mechanical switch 1290 may be a standard decorator paddle switch. The load control system may further include one or more electrical loads, such as lighting loads. The mechanical switch 1290 may be coupled in series electrical connection between an alternating current (AC) power source and the one or more electrical loads.

The mechanical switch 1290 may include a paddle actuator 1292 that may be actuated to turn on and/or turn off, the one or more electrical loads. The mechanical switch 1290 may include a bezel 1293 that surrounds the paddle actuator 1292. An upper portion of the paddle actuator 1292 may protrude from the bezel 1293 (e.g., in a first orientation) when the electrical load is off, and a lower portion of the paddle actuator 1292 may protrude from the bezel 1293 when the electrical load is on, or vice versa. The mechanical switch 1290 may include a yoke (not shown) that enables mounting of the mechanical switch 1290 to a structure. For example, the yoke may be fastened to a single-gang wallbox that is installed in an opening of a structure (e.g., such as a wall, ceiling, etc.). As shown, a faceplate 1296 may be secured to the mechanical switch 1290, for instance to the yoke. The faceplate 1296 may define a front surface 1261 and an opposed rear surface 1263. The front surface 1261 may alternatively be referred to as an outer surface of the faceplate 1296, and the rear surface 1263 may alternatively be referred to as an inner surface of the faceplate 1296. The faceplate 1296 may be made of any suitable material, such as plastic. The remote control device 1200 may be configured to be installed over the paddle actuator 1292 of the mechanical switch 1290 (e.g., mounted to the paddle actuator 1292, the bezel 1293, and/or the faceplate 1296).

The remote control device 1200 may include a base 1220 and a control unit 1230 (e.g., a control module). The control unit 1230 may be mounted to the base 1220. For example, the base 1220 may be configured to attach the remote control device 1200 to the mechanical switch 1290. The remote control device 1200 may also include a spacer 1210, which may be a shim and may be configured to compensate for mechanical switches having paddle actuators 1292 that protrude at greater lengths from the bezel 1293. The control unit 1230 may be mounted to the base 1220 with or without the spacer 1210. When the spacer 1210 is used, the spacer 1210 may be attached to the base 1220 and the control unit 1230 may be attached to the spacer 1210.

The base 1220 may alternatively be referred to as a base portion, a mounting frame, or a mounting assembly. The control unit 1230 and the base 1220 may be configured such that the control unit 1230 may be removably attached to the base 1220. The base 1220 may be mounted over (e.g., attached to) the paddle actuator 1292 of the mechanical switch 1290 without removing the faceplate 1296. In this regard, the remote control device 1200 may be mounted over an installed mechanical switch, such as the mechanical switch 1290, without the need to remove the faceplate 1296 and/or perform any electrical re-wiring of the mechanical switch 1290. For example, the base 1220 may be attached to the bezel 1293 of the mechanical switch 1290 using an adhesive 1205. The adhesive 1205 may be configured to secure the base 1220 to the bezel 1293.

As shown, the base 1220 may define a frame 1221. The frame 1221 may define primary attachment tabs 1222. The primary attachment tabs 1222 may be configured to releasably secure the control unit 1230 to the base 1220. The primary attachment tabs 1222 may be configured to engage the control unit 1230 (e.g., a complementary structure of the control unit 1230). The frame 1221 may further define apertures 1224. The apertures 1224 may be configured to engage the spacer 1210 (e.g., a complementary structure of the spacer 1210).

The spacer 1210 may define auxiliary attachment tabs 1212. The auxiliary attachment tabs 1212 may be configured to engage the control unit 1230 (e.g., complementary structure of the control unit 1230). The spacer 1210 may define primary snaps 1214. The primary snaps 1214 may be configured to engage the primary attachment tabs 1222 of the base 1220. For example, the primary snaps 1214 may releasably secure with the primary attachment tabs 1222 of the base 1220 such that the spacer 1210 is releasably attached to the base 1220. The spacer 1210 may define clips 1216. The clips 1216 may be configured to engage the base 1220 when the spacer 1210 is attached to the base 1220. For example, the clips 1216 may be configured to secure the spacer 1210 to the base 1220. The spacer 1210 may define pins 1218. The pins 1218 may be configured to align and/or maintain alignment between the spacer 1210 and the base 1220. The pins 1218 may extend from a perimeter of the spacer 1210. The pins 1218 may be configured to be received by the base 1220 (e.g., complementary structure of the base 1220). For example, the pins 1218 may be received by the apertures 1224 when the spacer 1210 is attached to the base 1220.

The control unit 1230 may include a user interface comprising an actuation member 1232, a housing 1234, and a battery holder 1270. For example, the actuation member 1232 may be attached to the housing 1234. The housing 1234 may define an upper wall 1241, a lower wall 1242, and opposed side walls 1243. The upper wall 1241, the lower wall 1242, and the side walls 1243 of the housing 1234 may extend from respective edges of the actuation member 1232 (e.g., from a perimeter defined by the actuation member 1232). The housing 1234 may define primary snaps 1252 and/or auxiliary snaps 1254. For example, the upper wall 1241 and the lower wall 1242 may define primary snaps 1252 and/or auxiliary snaps 1254. The control unit 1230 may be attached to the base 1220 using the primary snaps 1252 and/or to the spacer 1210 using the auxiliary snaps 1254. The primary snaps 1252 may be configured to engage the primary attachment tabs 1222 of the base 1220. For example, the primary snaps 1252 may engage the primary attachment tabs 1222 of the base 1220 when the spacer 1210 is not used. The auxiliary snaps 1254 may be configured to engage the auxiliary attachment tabs 1212 of the spacer 1210. For example, the auxiliary snaps 1254 may engage the auxiliary attachment tabs 1212 of the spacer 1210 when the spacer 1210 is used.

The housing 1234 of the control unit 230 may include a pivot bar 1250. The pivot bar 1250 may extend between the opposed side walls 1243 of the housing 1234. The pivot bar 1250 may be configured to receive the battery holder 1270. For example, the battery holder 1270 may pivotally mount to the pivot bar 1250. The battery holder 1270 may pivot about the pivot bar 1250 between a first position and a second position. The first position may correspond to the battery holder being proximate to the lower wall 1242 of the housing 1234, while the second position may correspond to the battery holder 1270 being proximate to the upper wall 1241 of the housing 1234.

The control unit 1230 may include a printed circuit board (PCB) 1244 (e.g., a flexible or rigid printed circuit board). The PCB 1244 may include a processor or controller and a touch sensitive device (e.g., which itself may include a separate processor). As such, in some examples, the PCB 1244 may act as both a main PCB and a capacitive touch PCB (e.g., may operate similarly as the main PCB 240 and the capacitive touch PCB 260 of the control device 200). The control unit 1230 may also include a light bar 1239 configured to be illuminated by one or more light sources 1237 (e.g., one or more LEDs), that for example, may be arranged in a manner similar to as done in the control device 200). The control device 600 may comprise a diffuser that includes a portion that extends through an elongated opening in the actuation member 1232 to form the light bar 1239. The light bar 1239 may be illuminated via a light guide film 1246 on the printed circuit board 1244. For example, the light sources 1237 on the printed circuit board 1244 may illuminate the light bar 1239 through the light guide film 1246. The light bar 1239 may be illuminated to visibly display information to a user of the control unit 1230. The front surface 1235 of the actuation member 1232 may be actuated along the light bar 1239 to adjust the amount of power delivered to the lighting load according to the position of the actuation.

Figure 13:
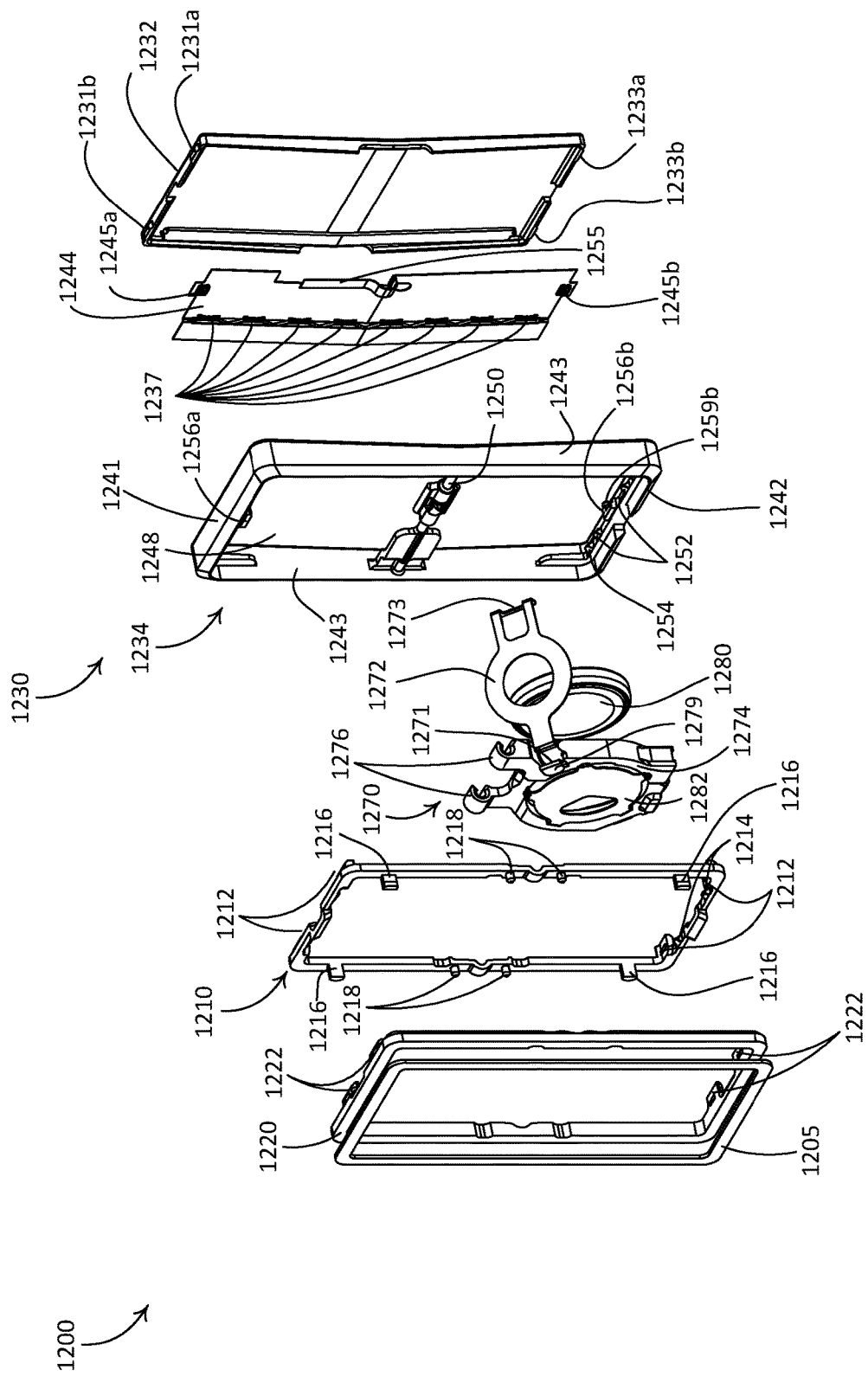

As shown in FIGS. 8-13, the control unit 1230 may be rectangular in shape and elongate between the upper wall 1241 and the lower wall 1242. It should be appreciated that the control unit 1230 is not limited to the illustrated rectangular geometry, and that control unit may alternatively be configured with other suitable geometries. In accordance with the illustrated orientation of the control unit 1230, the upper wall 1241 may be referred to as an upper end of the control unit 1230 and the lower wall 1242 may be referred to as a lower end of the control unit 1230. The upper and lower walls 1241, 1242 of the control unit 1230 may also be referred to as first and second ends of the housing 1234, respectively. The control unit 1230 (e.g., the housing 1234) may define a void 1248 (FIG. 13). The void 1248 may be configured to receive the printed circuit board 1244 in an attached position. The void 1248 may be defined by the upper wall 1241, the lower wall 1242, and the opposing side walls 1243. The void 248 may include an upper portion that is defined between the pivot bar 1250 and the upper wall 1241, and a lower portion that is defined between the pivot bar 1250 and the lower wall 1242. The housing 1234 may be made of any suitable material, such as plastic or metal.

The control unit 1230 may operate in a similar manner as the control device 200. However, the control unit 1230 may not comprise an internal load control device, but may be configured to transmit (e.g., wirelessly transmit) message (e.g., digital messages) for controlling one or more electrical loads in response to actuations of the actuation member 1232. For example, the actuation member 1232 may include a front surface 1235 having an upper portion 1236 and a lower portion 1238, and the control unit 1230 may be configured to control an electrical load in response to actuation of the upper or lower portions 1236, 1238 of the actuation member 1232. The actuation member 1232 may also receive user inputs that do not cause the actuation member 1232 to pivot. For example, the control unit 1230 may be configured to control an electrical load in response to touch actuations along the front surface 1235 of the actuation member 1232.

The control unit 1230 (e.g., the PCB 1244) may include mechanical switches, such as first and second tactile switches 1245a, 1245b, that are configured to be actuated in response to actuations (e.g., tactile actuations) of the upper portion 1236 and the lower portion 1238 of the actuation member 1232, respectively (e.g., to control turning the load on and off). For example, the control unit 1230 may be configured to control a lighting load of the lighting control system 100 to turn the load on in response to an actuation of the first tactile switch 1245a and to turn the load off in response to an actuation of the second tactile switch 1245b (or vice versa). For example, the control device 1200 may be configured to turn the lighting load on to a previous intensity level (e.g., before the lighting load was previously turned off) or to a preset intensity level (e.g., a predetermined or locked preset intensity level) in response to a tactile actuation of the upper portion 1236 of the actuation member 1232. The tactile actuation of the actuation member 1232 may cause one of the first and second tactile switches 1245a, 1245b of the PCB 1244 to be actuated. For example, the control unit 1230 (e.g., the housing 1234) may define a first nub 1259a and a second nub 1259b. When the upper portion 1236 of the actuation member 1232 is actuated, the first tactile switch 1244a may be moved toward the first nub 1259a. As such, the actuation of the upper portion 1236 the actuation member 1232 may cause the first tactile switch 12441 to move toward and contact the first nub 1259a. Similarly, when the lower portion 1238 of the actuation member 1232 is actuated, the second tactile switch 1244b may be moved toward the second nub 1259b. As such, the actuation of the lower portion 1238 the actuation member 1232 may cause the second tactile switch 1244b to move toward and contact the second nub 1259b.

The actuation member 1232 may be configured to pivot in response to a tactile actuation of the upper portion 1236 and the lower portion 1238. The actuation member 1232 may pivot about a lower axis in response to a tactile actuation of the upper portion 1236 of the actuation member and pivot about an upper axis in response to a tactile actuation of the lower portion 1238 of the actuation member 1232 (e.g., as opposed to pivoting about a midpoint of the actuation member). For example, the upper wall 1241 of the housing 1234 may include first and second recesses (not shown), and the lower wall 1242 of the housing 1234 may include first and second recesses 1253a, 1253b, respectively. Further, the actuation portion 1232 may include first and second top notches 1231a, 1231b, respectively, and first and second bottom notches 1233a, 1233b, respectively. As such, when the upper portion 1236 of the actuation member 1232 is actuated, the first and second bottom notches 1233a, 1233b of the actuation member 1232 may pivot about the first and second recesses 1253a, 1253b of the lower wall 1242, and the first tactile switch 1244a may be moved toward and contact the first nub 1259a. Similarly, when the lower portion 1238 of the actuation member 1232 is actuated, the first and second top notches 1231a, 1231b of the actuation member 1232 may pivot about the first and second recesses (not shown) of the upper wall 1241, and the second tactile switch 1244b may be moved toward and contact the second nub 1259b.

The actuation member 1232 may also receive user inputs that do not cause the actuation member 1232 to pivot. The control unit 1230 may be configured to control an electrical load in response to touch actuations along the front surface 1235 of the actuation member 1232. For example, at least a portion of the front surface 1235 of the actuation member 1232 may be configured as a touch sensitive surface (e.g., a capacitive touch surface) that is configured to receive (e.g., detect) inputs (e.g., touch actuations/inputs), such as point actuations or gestures, from a user of the control device 1200. The touch sensitive surface of the actuation member 1232 may be located adjacent to and/or overlap with the light bar 1239. For example, during a normal operating mode of the control device 1200, the front surface 1232 of the actuation member 1232 may be actuated along the light bar 1239 (e.g., along the touch sensitive surface) to adjust the amount of power delivered to, and thus the intensity level of, the lighting load according to the position of the touch actuation, for example, between a low-end intensity level $L_{LE}$ and a high-end intensity level $L_{HE}$. Although described primarily in context of a capacitive touch surface, it should be appreciated that the control device 1200 is not so limited, and in some examples, at least a portion of the front surface 1235 of the actuation member 1232 may be configured as a different type of touch sensitive surface, such as a resistive touch surface, an inductive touch surface, a surface acoustic wave (SAW) touch surface, an infrared touch surface, acoustic pulse touch surface, or the like.

The control device 1200 may control the magnitude of a load current conducted through the lighting load based on a single discrete input along the touch sensitive surface and/or based on a plurality of consecutive inputs along the touch sensitive surface. For example, the user may tap their finger at a position along the touch sensitive surface, and in response, the control device 1200 may turn the lighting load on to an intensity level based on the position. As an example, if the lighting load is off, the control device 1200 may turn the lighting load on to an intensity level based on the position of a touch actuation along the touch sensitive surface of the actuation member 1232. While the lighting load is on, the user may move (e.g., slide) their finger along the touch sensitive surface, and in response, the control device 1200 may adjust (e.g., continuously control) the magnitude of the load current conducted through the lighting load based on the positions of a plurality of inputs along the touch sensitive surface.

Further, in a color control mode, the control device 1200 may control a color of the lighting load based on the position of a touch actuation along the touch sensitive surface of the actuation member 1232 (e.g., by controlling a color temperature of the lighting load or by applying full color control over the lighting load). For example, the light bar 1239 may be configured to illuminate a spectrum of colors through the length of the light bar 1239 (e.g., across the full visible color spectrum, a subset of the visual color spectrum, and/or the light spectrum associated with the color temperatures of a black body radiator). Accordingly, the control device 1200 may control the color of the lighting load based on the position of a touch actuation along the touch sensitive surface, and in turn, the corresponding color of that position on the light bar 1239.

The PCB 1244, which may include capacitive touch pads that creates a touch sensitive surface on the actuation member 1232, may be affixed to the actuation member 1232 and may be responsive to touch actuations. The front surface 1235 of the actuation member 1232 of the control unit 1230 may define a user interface that is configured to receive inputs, such as gestures, from a user of the remote control device 1200. The user interface may be configured as a touch sensitive surface (e.g., a capacitive touch surface) that is configured to receive (e.g., detect) inputs, such as gestures, from a user of the control unit 1230. For example, the printed circuit board 1244 may include one or more capacitive touch regions, or surfaces (e.g., similar to the receiving capacitive touch pads 244 on the capacitive touch PCB 240 of the control device 200). The printed circuit board 1244 may include one or more linear capacitive touch regions that faces an inner surface of the actuation member 1232 when the printed circuit board 1244 is disposed in the void 1248. The front surface 1235 of the actuation member 1232 may be configured to detect touches along an x-axis, a y-axis, or both an x-axis and a y-axis. Accordingly, the actuation member 1232, when actuated, may pivot to actuate one of the first or second tactile switches 1244*a*, 1244*b*, such that tactile actuations of the actuation member 1232 may cause movement of the PCB 1244.

The control unit 1230 may further include a control circuit (e.g., a processor, not shown) and a wireless communication circuit (e.g., an RF transceiver, not shown) mounted to the PCB 1244. The control unit 1230 may be configured to translate one or more inputs (e.g., user inputs) from the user interface into respective control signals that may be used to control a load control device of a load control system. The one or more inputs may be applied via touches or presses of the upper portion 1236 and/or lower portion 1238 of the actuation member 1232. For example, the control circuit may be configured to receive input signals (e.g., that correspond to the user inputs) in response to actuations of the upper portion 1236 and/or lower portion 1238 by a user of the remote control device 1200. For example, the input signals received by the control circuit may be the respective control signals translated from the control interface inputs. The control circuit may be configured to generate commands that the user desires the control unit 1230 to execute in response to the input signals produced in response to actuations of the upper portion 1236 and/or lower portion 1238. The control unit 1230 may be configured to cause the wireless communication circuit to transmit one or more control signals including the commands generated by the control circuit.

The control circuit may be configured to cause the wireless communication circuit to transmit respective commands that correspond to inputs and/or gestures received by the upper portion 1236 and/or lower portion 1238. For example, the remote control device 1200 may be operable to transmit wireless signals, for example radio frequency (RF) signals, to a load control device, one or more electrical loads, and/or a central processor of a load control system. The remote control device 1200 may be associated with the load control device and the one or more electrical loads during a configuration procedure of the load control system.

The control circuit may be configured to cause the wireless communication circuit to transmit respective commands that correspond to interpreted gestures received at the touch sensitive surface. For example, the remote control device 1200 may be operable to transmit wireless signals, for example radio frequency (RF) signals, to a load control device, one or more electrical loads, and/or a central processor of a load control system. The remote control device 1200 may be associated with the load control device and the one or more electrical loads during a configuration procedure of the load control system.

The light bar 1239 of the control unit 1230 may be configured to provide a visual indication of a command issued by the remote control device 1200. The light bar 1239 may be illuminated by a plurality of LEDs (not shown) mounted to the PCB 1244. The diffuser of the control unit 1230 may comprise (e.g., be made of) a diffusive material, and may operate to scatter the light received from the LEDs. The light bar 1239 may be illuminated in response to actuations of the actuation member 1232 in a similar manner as the light bar 220 of the control device 200. The control circuit may be configured to, upon receiving a touch actuation indicative of a command to change an amount of power delivered to an electrical load, such as a command to dim a lighting load, indicate the amount of power delivered to the electrical load by temporarily illuminating a number of the LEDs that corresponds with the desired amount of power (e.g., the desired dimming level of the lighting load). The control circuit may be configured to control the LEDs in manners similar to as described herein with respect to FIGS. 4A and 4B.

Figure 9:
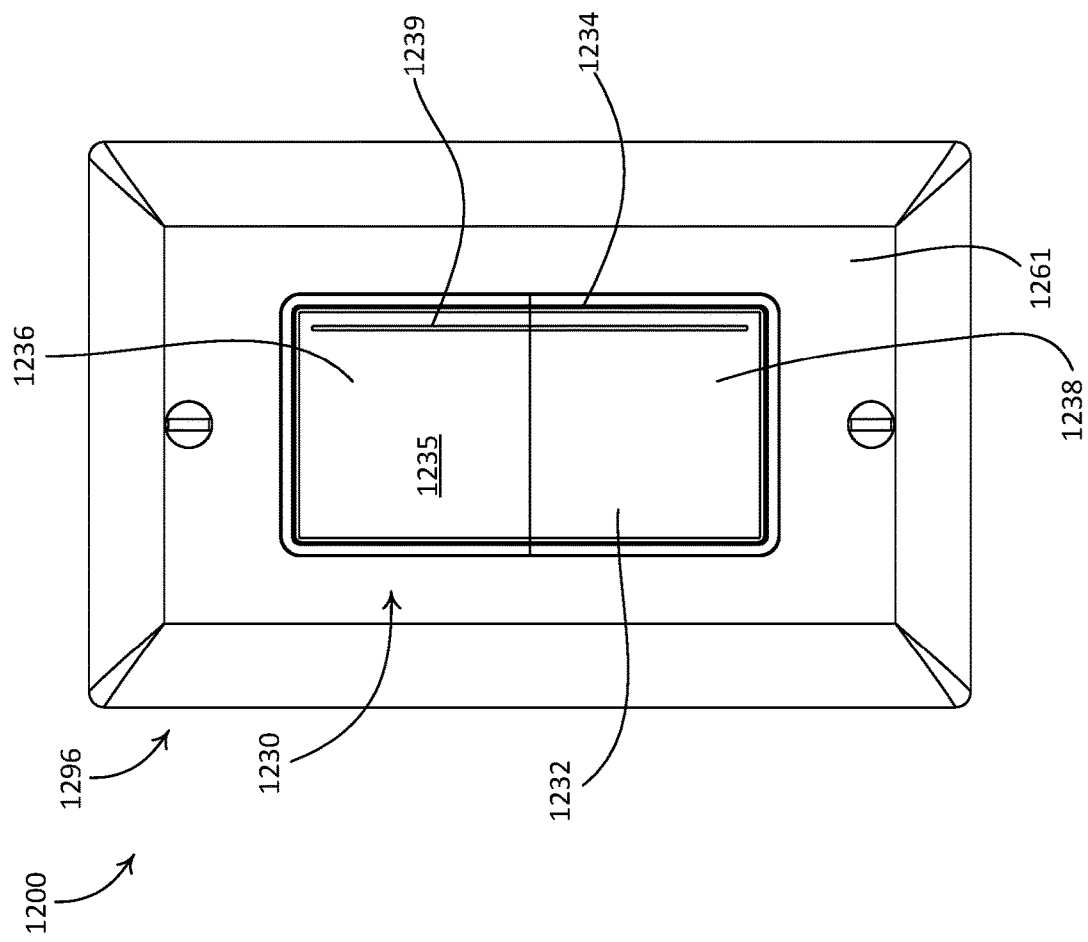
Figure 11:
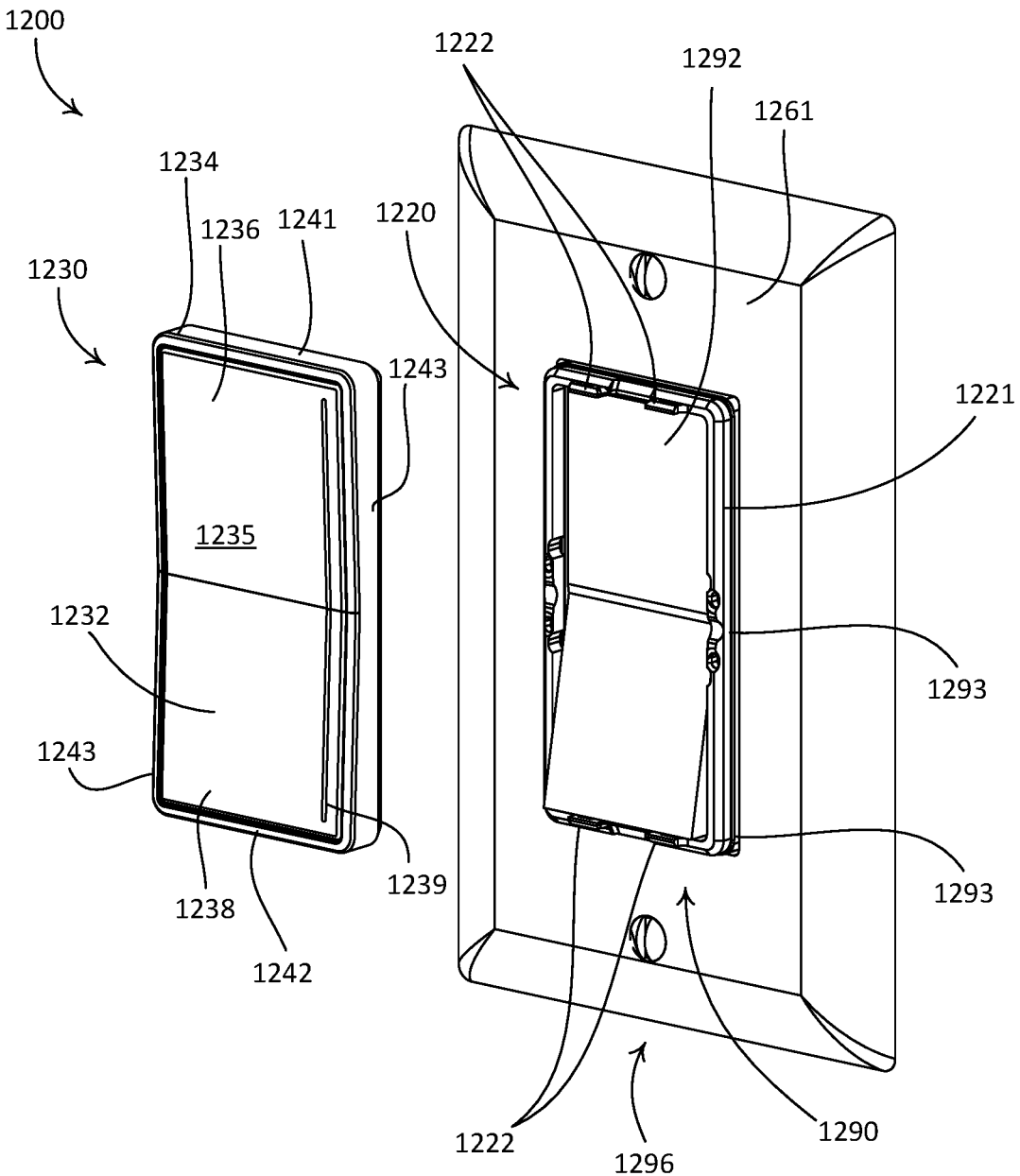
Figure 12:
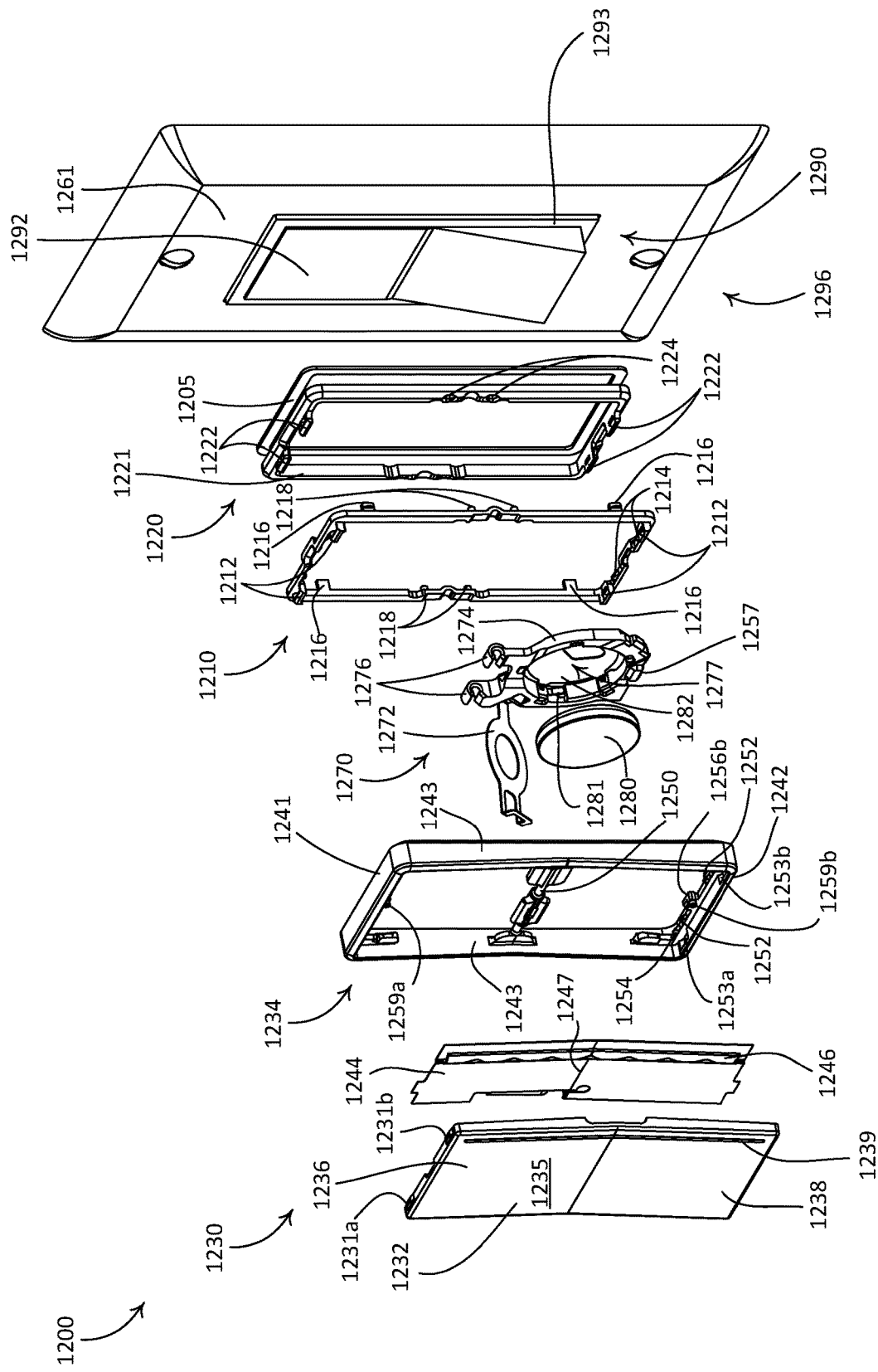

The control unit 1230 may be configured to be attached to the base 1220 with the light bar 1239 located on a predetermined side of the control unit 1230 (e.g., the right side of the control unit as shown in FIG. 9), for example, such that the light bar 1239 may be illuminated to indicate the amount of power presently being delivered to the electrical load. The printed circuit board 1244 may define a fold 1247 such that the light sources 1237 mounted thereto illuminate through the printed circuit board 1244 and light guide film 1246 to the light bar 1239 (e.g., as shown in FIGS. 4A-C).

The illustrated control unit 1230 may be battery-powered. The battery 1280 (e.g., the illustrated coin cell battery) may be placed in electrical communication with the circuitry mounted to the printed circuit board 1244, for instance to power the capacitive touch regions, the control circuit, the wireless communication circuit, and/or other circuitry of the control unit 1230.

The control unit 1230 may be configured to receive the battery holder 1270. The battery holder 1270 may include a housing 1274, a retaining clip 1272, positive battery contact 1281, and a negative battery contact 1282 (e.g., a backplate). The positive battery contact 1281 may be a positive electrical contact and the negative battery contact 1282 may be a negative electrical contact. For example, the positive battery contact 1281 and the negative battery contact 1282 may be connected to the housing 1274. The battery holder 1270 may be configured to retain the battery 1280 therein. The battery holder 1270 may define a cavity 1277. For example, the housing 1274 and the negative battery contact 1282 may define the cavity 1277. The negative battery contact 1282 may be configured to attach to the housing 1274. The negative battery contact 1282 may be configured to define a rear surface of the cavity 1277. The cavity 1277 may be configured to receive the battery 1280. The retaining clip 1272 may be configured to secure the battery 1280 within the cavity 1277. The retaining clip 1272 may define a pivot clip 1271 and a locking clip 1273. The pivot clip 1271 may pivotally mount the retaining clip 1272 to the battery holder 1270. For example, the retaining clip 1272 may pivot using the pivot clip 1271. The locking clip 1273 may be configured to secure the retaining clip 1272 to the housing 1274 such that the battery 1280 is retained therein. The pivot clip 1271 may comprise a retention tab 1279 that may retain the pivot clip 1271 in the battery holder 1270 when the retaining clip 1272 is moved to the open position.

The battery holder 1270 may be configured to be installed within the void 1248 defined by the control unit 1230 (e.g., the housing 1234). For example, the void 1248 may be configured to receive the battery holder 1270. The battery holder 1270 may be configured to retain the battery 1280 therein. The battery holder 1270 may include attachment clips 1276. The attachment clips 1276 may be c-clips (e.g., such as right-angle c-clips). The attachment clips 1276 may be configured to rotatably attach to the pivot bar 1250. For example, the attachment clips 1276 may be configured to pivot about the pivot bar 1250, for example, as the battery holder is moved between the first position and the second position. The pivot bar 1250 may define a pivot axis. The battery holder 1270 may be configured to pivot about the pivot axis. The pivot axis may be located at a midpoint of the control unit 1230. Alternatively, the pivot bar 1250 may be a pin (e.g., a rod) and the battery holder 1270 may comprise fully closed loops rather than the attachment clips 1276. The pin may be slid into the closed loops of the battery holder and then the ends of the pin may be attached to the housing 1234.

The battery holder 1270 may be configured to electrically connect the battery 1280 to the control unit 1230 (e.g., the printed circuit board 1244) for powering the circuitry of the control unit 1230. The battery holder 1270 may be configured to maintain electrical contact between the battery 1280 and the printed circuit board 1244 when the battery holder 1270 is moved between the first position and the second position. For example, the positive battery contact 1281 and the negative battery contact 1282 of the battery holder 1270 may be configured to be electrically connected to a positive terminal and a negative terminal of the battery 1280, respectively, when the battery is received in the cavity 1277. The positive battery contact 1281 may operate as a spring that is biased towards the battery 1280 when the battery is received in the cavity 1277.

The control unit 1230 may include a flexible cable (not shown) that is attached (e.g., mechanically and electrically connected) to the printed circuit board 1244. The flexible cable may be attached (e.g., mechanically and electrically connected) to the battery holder 1270. The flexible cable may comprise at least two electrical conductors (not shown) for electrically connecting the circuitry of the control unit 1230 on the printed circuit board 1244 to the positive and negative terminals of the battery 1280. For example, a first one of the electrical conductors of the flexible cable may be electrically connected to positive battery contact 1281 and a second one of the electrical conductors of the flexible cable may be electrically connected to the negative battery contact 1282. Alternatively, the retaining clip 1272 may operate as a positive battery contact of the battery holder 1270.

It should be appreciated that electrical connection between the battery 1280 and the printed circuit board 1244 may be achieved in other ways. For example, the battery holder 1270 may abut a first post (not shown) on the control unit 1230 in the second position and may abut a second post (not shown) on the control unit 1230 in the first position. The first post and the second post may be configured to provide the electrical connection between the battery 1280 and the printed circuit board 1244. The first post may be proximate to the upper wall 1241 and the second post may be proximate to the lower wall 1242.

The battery holder 1270 may be configured to adjust the location of the battery 1280 within the control unit 1230. For example, the location of the battery 1280 may be adjusted based on the position of the paddle actuator 1292 when power is being delivered to the electrical load(s) associated with the mechanical switch 1290. The battery holder 1270 may be operable between a first position and a second position. For example, the battery holder 1270 may be configured to be pivoted between the first position and the second position. The first position may be defined as the battery holder 1270 proximate to the lower wall 1242 (e.g., a lower portion of the void 1248). For example, the battery holder 1270 may be in the lower portion of the void 1248 when the battery holder 1270 is in the first position. The second position may be defined as the battery holder 1270 proximate to the upper wall 1241 (e.g., an upper portion of the void 1248). For example, the battery holder 1270 may be in the upper portion of the void 1248 when the battery holder 1270 is in the second position.

The control unit 1230 (e.g., the housing 1234) may define stops 1256a, 1256b in the upper portion and the lower portion of the void 1248. The stops 1256a, 1256b may extend into the void 1248 from the upper wall 1241 and the lower wall 1242. The stops 1256a, 1256b may be configured to prevent the battery holder 1270 from pivoting beyond the first position and the second position, respectively. The stops 1256a, 1256b may be configured to prevent the battery holder 1270 from abutting the printed circuit board 1244. The stops 1256a, 1256b may be configured to snap into an outer edge 1257 of the housing 1274 of the battery holder 1270 when the battery holder 1270 is in the first position or the second position. The control unit 1230 may be configured to be attached to the base 1220 with the light bar 1239 located on a predetermined side of the control unit (e.g., the right side of the control unit as shown in FIG. 9), for example, such that the light bar 1239 may be illuminated to indicate the amount of power presently being delivered to the electrical load. The control unit 1230 may be configured to be attached to base 1220 with the light bar 1239 located on a predetermined side of the control unit independent of a position of the paddle actuator 1292 of the mechanical switch 1290 (e.g., whether the upper portion or the lower portion of the paddle actuator 1292 is protruding from the bezel 1293). For example, the control unit 1230 may be configured such that the battery 1280 can be pivoted between the first position and the second position based on whether the upper portion or the lower portion of the paddle actuator 1292 is protruding from the bezel 1293.

The void 1248 of the control unit 1230 may be configured to receive a portion of the paddle actuator 1292 of the mechanical switch 1290 when the control unit 1230 is attached to the base 1220. The control unit 1230 may define separate portions of the void 1248, for example, the upper portion and the lower portion. When the mechanical switch 1290 is in a first orientation (e.g., when the upper portion of the paddle actuator 1292 is protruding from the bezel 1293), the upper portion may receive the upper portion of the paddle actuator 1292 and the lower portion may receive the battery holder 1270. When the mechanical switch 1290 is in a second orientation (e.g., when the lower portion of the paddle actuator 1292 is protruding from the bezel 1293), the lower portion may receive the portion of the lower portion of the paddle actuator 1292 and the upper portion may receive the battery holder 1270.

In some installations, the control unit 1230 may not be offset from the paddle actuator 1292 of the mechanical switch 1290 by enough distance when control unit 1230 is mounted to the base 1220, and the control unit 1230 may even contact the paddle actuator 1292. In this scenario, the control unit 1230 may cause the paddle actuator 1292 of the mechanical switch 1290 to change from the on position to the off position when a user actuates the actuation member 1232. The control unit 1230 (e.g., the housing 1234) may define flanges in the upper portion and the lower portion of the void 1248. The flanges may extend into the void 1248 from the opposed side walls 1243. When the control unit 1230 is being mounted onto the base 1220 during installation of the remote control device 1200, the flanges 1268 may contact the paddle actuator 1292 to indicate to the installer that the control unit 1230 may not be offset from the paddle actuator 1292 by enough distance. The installer may then install the spacer 1210 (or multiple spacers) onto the base 1220 to provide additional distance between the control unit 1230 and the paddle actuator 1292.

Figure 14:
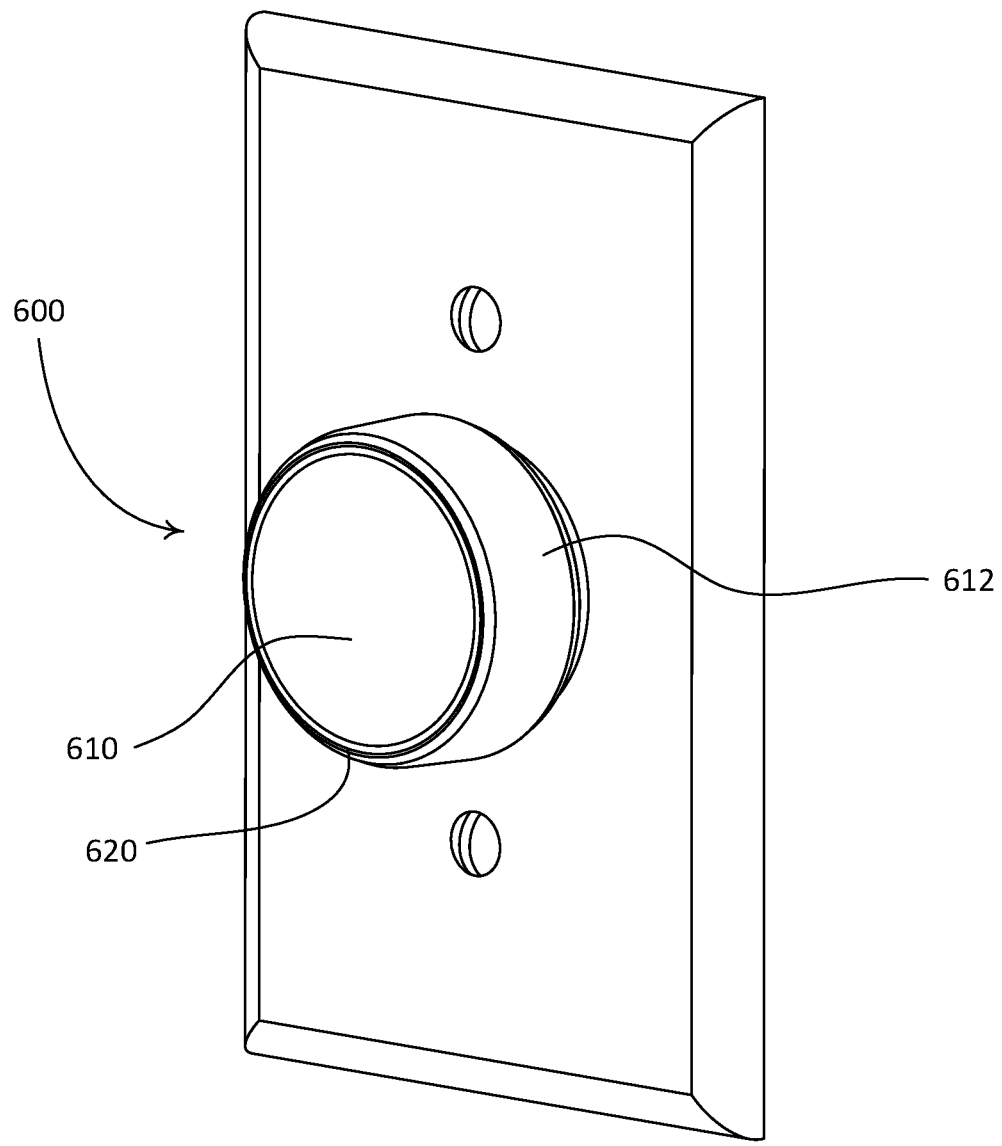
FIG. 14 is a perspective view of an example control device comprising a circular light bar that may be deployed as a dimmer switch and/or a remote control device of the load control system illustrated in FIG. 1.

FIG. 14 is a perspective view of an example control device 600 comprising a circular light bar 620, which may be deployed as a dimmer switch and/or a remote control device of the load control system illustrated in FIG. 1. The control circuit 600 may also comprise an actuation member 610 and a rotation portion 612. The control device 600 may comprise a wall-mounted dimmer switch and/or a remote control device, for example, that may be mounted over and/or to a paddle actuator of a mechanical switch (e.g., a light switch) that may be controlling the power delivered to an electrical load (e.g., a lighting load). The control circuit 600 may be configured to turn a lighting load on and off in response to actuation of the actuation member 610 and adjust an intensity level of the lighting load in response to rotations of the rotation portion 612. A portion of the circular light bar 620 may be illuminated in response to actuations of the actuation member 610 and/or the rotation portion 612, for example, in a similar manner as the light bar 220 of the control device 200. For example, the portion of the circular light bar 620 that is illuminated may begin at the bottom 624 of the circular light bar 620 and may extend in a clockwise direction for an amount that indicates the intensity level of the lighting load. For example, an intermediate LED that is illuminated at an endpoint of the illuminated portion may be illuminated to an intermediate intensity level (e.g., as described herein).

Figure 15C:
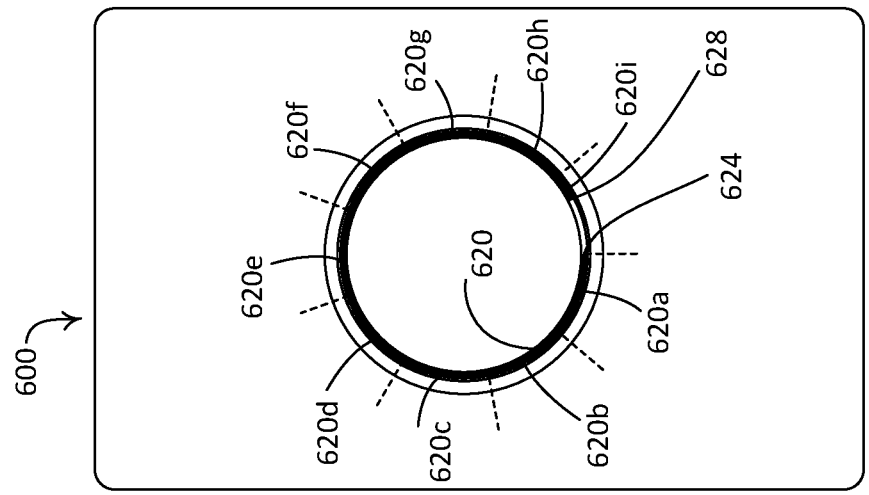
FIGS. 15A-15C are front views of the control device of FIG. 14 illustrating the light bar illuminated to indicate various intensity levels.
Figure 15B:
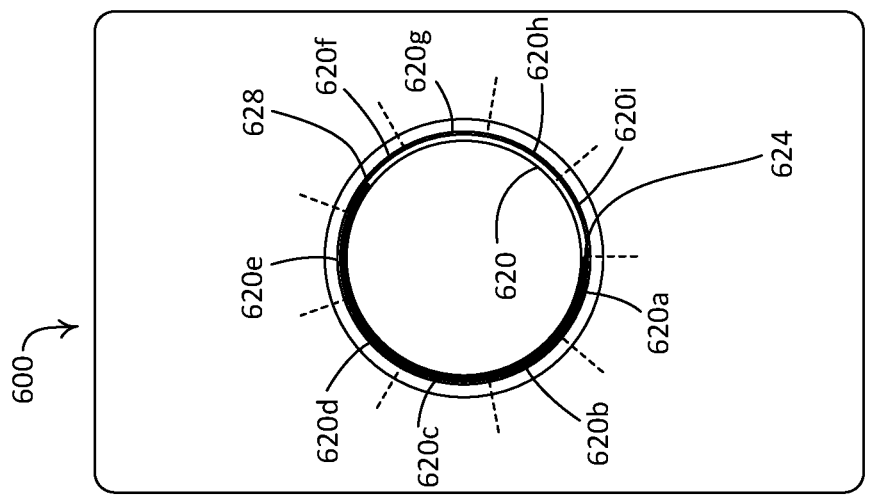
Figure 15A:
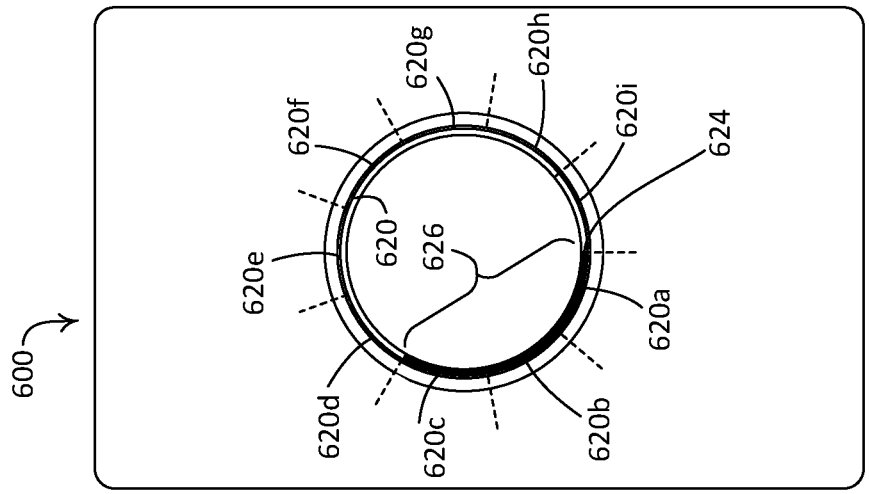

FIGS. 15A-15C are front views of the control device 600 illustrating the light bar illuminated to indicate various intensity levels (e.g., as will be described in greater detail below). The control device 600 may comprise a diffuser that includes a portion that extends through an elongated opening in the actuation member 610 to form the light bar 620. For example, the light bar may be a portion of the diffuser that extends through the elongated opening. The control device 600 may also comprise one or more respective light sources, e.g., a number $N_{LED-TOTAL}$ of light-emitting diodes (LEDs) located inside of the enclosure of the control device 600, that are configured to illuminate the light bar 620. The LEDs may be mounted to a printed circuit board (PCB) housed in the enclosure of the control device 600. The LEDs may be arranged in a circular array below the diffuser and the light bar. For example, the LEDs may comprise nine LEDs (e.g., $LED_1$ (e.g., at the bottom of the PCB) through $LED_9$ (e.g., at the top of the PCB)). For example, the LEDs may comprise front-firing LEDs. Each LED may be configured to shine light onto the diffuser, such that each LED may be configured to illuminate a respective segment 620a-620i (e.g., as shown in FIG. 15A) when controlled to a maximum intensity level $L_{MAX}$ (e.g., 100%). For examples, the segments 620a-620i may be approximately equal in length. The diffuser may comprise (e.g., be made of) a diffusive material, and may operate to scatter the light received from the LEDs.

The control circuit may be configured to control the LEDs 640 to provide an indication of an intensity level $L_{LOAD}$ (e.g., a present or target lighting intensity level) of the lighting load. For example, the control circuit may be configured to control the LEDs 640 to illuminate a portion 626 of the light bar 6920 extending from the bottom of the light bar to indicate the intensity level $L_{LOAD}$ of the lighting load (e.g., as shown in FIG. 15A). The control circuit may be configured to illuminate a number $N_{LED-ON}$ of adjacent LEDs (e.g., starting with LEDs) so that the portion of the light bar 620 may be illuminated, for example, to indicate the intensity level $L_{LOAD}$ of the lighting load. The number $N_{LED-ON}$ of LEDs being illuminated may comprise all of the LEDs or a subset of the LEDs. For example, each segment 620a-620i of the light bar 620 may represent a portion $L_{SEG}$ (e.g., an equal portion) of the intensity level $L_{LOAD}$ of the lighting load depending upon the number $N_{LED-TOTAL}$ of LEDs included in the control device 600, e.g., $L_{SEG}=100\%/N_{LED-TOTAL}$. For example, when the number $N_{LED-TOTAL}$ of LEDs included in the control device 600 is nine, the portion $L_{SEG}$ of the intensity level $L_{LOAD}$ of the lighting load indicated by each LED (e.g., when controlled to the maximum intensity level $L_{MAX}$) may be approximately one-ninth of the dimming range of the control device or approximately 11.11%. When the intensity level $L_{LOAD}$ of the lighting load is approximately 33.33%, the control circuit may turn on $LED_1$ through $LED_3$ to the maximum intensity level $L_{MAX}$ to illuminate (e.g., fully illuminate) the first three segments 620a-620c of the light bar 620 as shown in FIG. 15A. When the intensity level $L_{LOAD}$ of the lighting load is approximately 44.44%, the control circuit may turn on $LED_1$ through $LED_4$ to the maximum intensity level $L_{MAX}$ to illuminate (e.g., fully illuminate) the first four segments 620a-620d of the light bar 620 as shown in FIG. 15B.

Some of the number $N_{LED-ON}$ of LEDs that are on may be illuminated to different intensity levels. The control circuit may be configured to illuminate a number $N_{LED-ON-MAX}$ of the LEDs to the maximum intensity level $L_{MAX}$ (e.g., 100%). For example, the number $N_{LED-ON-MAX}$ of the LEDs that are illuminated to the maximum intensity level may be equal to or less than the number $N_{LED-ON}$ of LEDs that are on. The control circuit may be configured to illuminate an intermediate LED (e.g., the last or final LED in the number $N_{LED-ON}$ of adjacent LEDs that are on) to an intermediate intensity level $L_{IM}$, which may range between a minimum intensity level $L_{MIN}$ (e.g., 0%) and the maximum intensity level $L_{MAX}$ (e.g., 100%). The intermediate LED may be located between the LEDs that are on at the maximum intensity level $L_{MAX}$ and the LEDs that are off. For example, the control circuit may be configured to pulse-width modulate (PWM) a voltage applied to the intermediate LED to adjust the intensity level of the intermediate LED to the intermediate intensity level $L_{IM}$. Since the diffuser operates to scatter the light at the light bar 620, the control circuit may be configured to adjust the location of an endpoint 628 of the illuminated portion of the light bar 620 (e.g., as shown in FIG. 15B-C) by adjusting the intensity of intermediate LED. For example, if the intensity level $L_{LOAD}$ of the lighting load is 40% (e.g., between the intensity levels indicated in FIGS. 15A and 15B), the control circuit may turn on the first three LEDs 240 (e.g., LEDs-LED$_3$) to the maximum intensity level $L_{MAX}$ and control the intermediate intensity level $L_{IM}$ of the fourth LED (e.g., LED$_4$) to a value between the minimum intensity level $L_{MIN}$ and the maximum intensity level $L_{MAX}$. For example, the control circuit may determine the intermediate intensity level $L_{IM}$ of the fourth LED to be approximately 60% (e.g., as will be described in greater detail below).

In addition, the control circuit may determine that a number $N_{DIM}$ of the LEDs should be illuminated to the intermediate lighting level $L_{IM}$. The control circuit may illuminate the first $N_{LED-ON-MAX}$ LEDs to a first intensity level (e.g., the maximum intensity level $L_{MAX}$) and illuminate the next $N_{DIM}$ LEDs to the intermediate intensity level $L_{IM}$. The control circuit may be configured to pulse-width modulate (PWM) a voltage applied to the final $N_{DIM}$ LEDs (e.g., intermediate LED(s)) to adjust the intensity level of the final $N_{DIM}$ LEDs to the intermediate intensity level $L_{IM}$. For example, if the intensity level $L_{LOAD}$ of the lighting load is 50%, the control circuit may turn on the first four LEDs 240 (e.g., LED$_1$-LED$_4$) to the maximum intensity level $L_{MAX}$ and control the fifth LED (e.g., LEDs) to an intermediate intensity level $L_{IM}$ of 50%.

Since the control device 600 comprises the diffuser and the control circuit is configured to control the intermediate LED to the intermediate intensity level $L_{IM}$, the control device 600 may control the light bar 620 to provide continuous illumination on the light bar 620, for example, despite the use of a limited number of LEDs. The light bar 620 may enhance not only the esthetic appeal of the control device 600 but also the functionality of the control device. For example, feedback indications may be provided with a finer granularity than if the LEDs 640 are controlled to only the maximum intensity level to illuminate the segments 620a-620i individually. The reduction in the number of LEDs may lead to reduced costs and/or simplified circuit design (e.g., which may be desirable considering the spatial constraints associated with the control device 600 and/or the main PCB of the control device 600). Examples of wall-mounted rotary dimmer switches and rotary remote control devices are described in greater detail in commonly-assigned U.S. Pat. No. 10,681,791, issued Jun. 9, 2020, entitled User Interface for a Control Device, the entire disclosure of which is hereby incorporated by reference.

Figure 16:
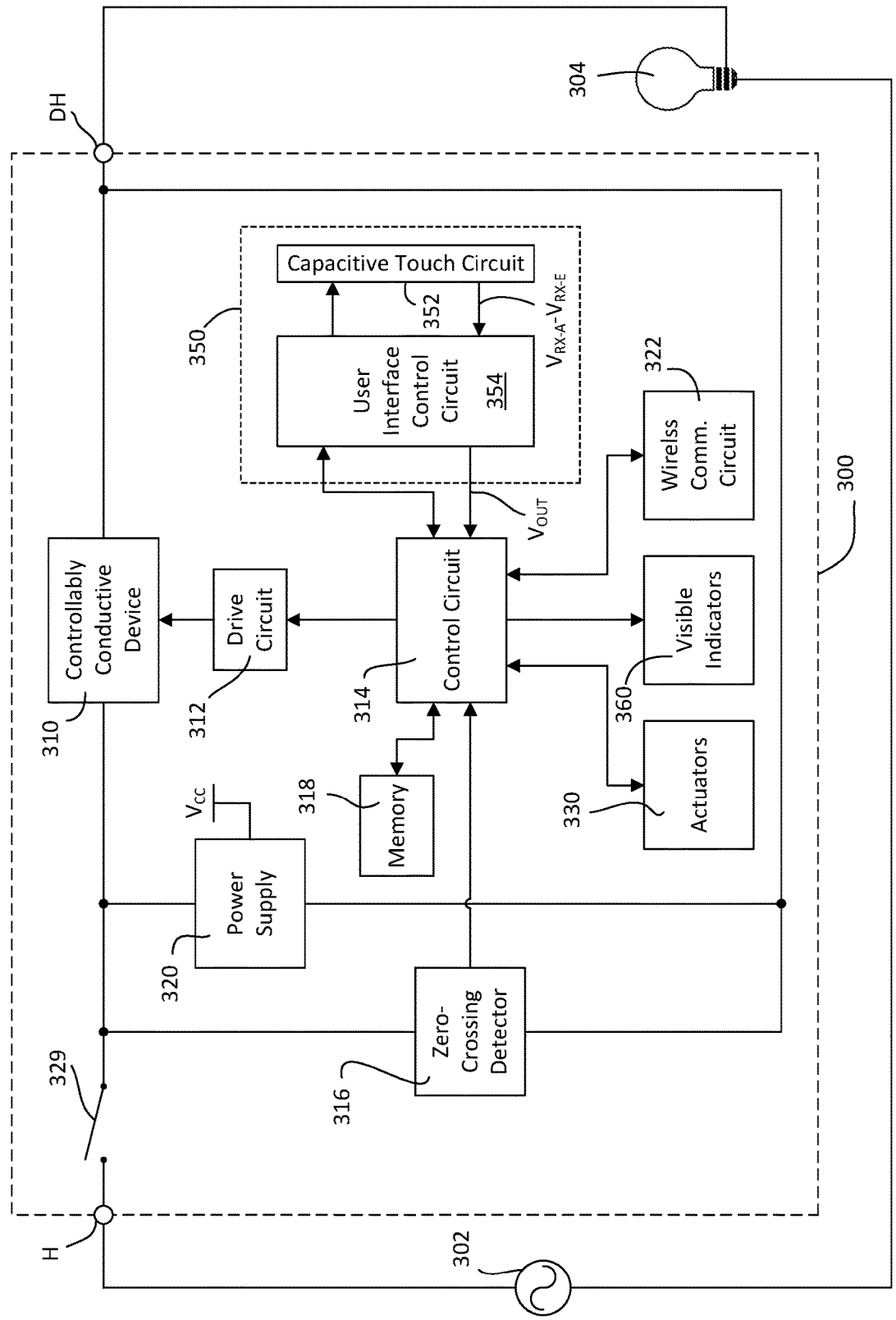
FIG. 16 shows a simplified equivalent schematic diagram of an example control device that may be deployed as a load control device (e.g., a dimmer switch) of the load control system illustrated in FIG. 1.

FIG. 16 is a simplified block diagram of an example control device 300 (e.g., a dimmer switch) that may be deployed as, for example, the dimmer switch 110 of the lighting control system 100, the control device 200, and/or the control device 300. The control device 300 may include a hot terminal H that may be adapted to be coupled to an AC power source 302. The control device 300 may include a dimmed hot terminal DH that may be adapted to be coupled to an electrical load, such as a lighting load 304. The control device 300 may include a load control circuit, such as, for example, a controllably conductive device 310 coupled in series electrical connection between the AC power source 302 and the lighting load 304. The controllably conductive device 310 may control the power delivered to the lighting load. The controllably conductive device 310 may include a suitable type of bidirectional semiconductor switch, such as, for example, a triac, a field-effect transistor (FET) in a rectifier bridge, two FETs in anti-series connection, or one or more insulated-gate bipolar junction transistors (IGBTs). An air-gap switch 329 may be coupled in series with the controllably conductive device 310. The air-gap switch 329 may be opened and closed in response to actuations of an air-gap actuator (not shown). When the air-gap switch 329 is closed, the controllably conductive device 310 may be operable to conduct current to the load. When the air-gap switch 329 is open, the lighting load 304 may be disconnected from the AC power source 302.

The control device 300 may include a control circuit 314. The control circuit 314 may include one or more of a processor (e.g., a microprocessor), a microcontroller, a programmable logic device (PLD), a field programmable gate array (FPGA), an application specific integrated circuit (ASIC), or any suitable controller or processing device. The control circuit 314 may be operatively coupled to a control input of the controllably conductive device 310, for example, via a gate drive circuit 312. The control circuit 314 may be used for rendering the controllably conductive device 310 conductive or non-conductive, for example, to control the amount of power delivered to the lighting load 304.

The control circuit 314 may receive a control signal representative of the zero-crossing points of the AC main line voltage of the AC power source 302 from a zero-crossing detector 316. The control circuit 314 may be operable to render the controllably conductive device 310 conductive and/or non-conductive at predetermined times relative to the zero-crossing points of the AC waveform using a phase-control dimming technique.

The control device 300 may include a memory 318. The memory 318 may be communicatively coupled to the control circuit 314 for the storage and/or retrieval of, for example, operational settings, such as, lighting presets and associated preset light intensities. The memory 318 may be implemented as an external integrated circuit (IC) or as an internal circuit of the control circuit 314. The control device 300 may include a power supply 320. The power supply 320 may generate a direct-current (DC) supply voltage $V_{CC}$ for powering the control circuit 314 and the other low-voltage circuitry of the control device 300. The power supply 320 may be coupled in parallel with the controllably conductive device 310. The power supply 320 may be operable to conduct a charging current through the lighting load 304 to generate the DC supply voltage $V_{CC}$.

The dimmer control circuit 314 may be responsive to user inputs received from actuators 330 and/or a touch sensitive device 350. It should be appreciated that in examples where the control device is a dual-dimmer, the control device may include two touch sensitive devices 350 or a single touch sensitive device that is responsive to two sets of capacitive touch elements, such as capacitive touch pads. The dimmer control circuit 314 may control the controllably conductive device 310 to adjust the intensity level of the lighting load 304 in response to the user inputs (e.g., tactile actuations and/or touch actuations) received via the actuators 330 and/or the touch sensitive device 350. The dimmer control circuit 314 may receive respective input signals from the actuators 330 in response to tactile actuations of the actuators 330 (e.g., in response to movements of the actuators 330). For example, the actuators 330 may be actuated in response to tactile actuations of an upper portion and/or a lower portion of the actuation member of the control device.

The touch sensitive device 350 may be configured to detect touch actuations (e.g., point actuations and/or gestures, where, for example, the gestures may be effectuated with or without physical contacts with the touch sensitive device 350), and provide respective output signals $V_{OUT}$ to the dimmer control circuit 314 indicating the touch actuations (e.g., indicating a position of one or more touch actuations). Further, the touch sensitive device 350 may detect a touch actuation (e.g., a press-and-hold actuation) applied to an area of the front surface of the actuation member that resides over the pivot axis and cause the dimmer control circuit 314 to enter an advanced programming mode, as described herein. The touch sensitive device 350 may also detect a touch actuation of the front surface along the light bar and cause the dimmer control circuit 314 to adjust the amount of power delivered to the lighting load 304 accordingly. The dimmer control circuit 314 may be configured to translate the input signals received from the actuators 330 and/or the output signals $V_{OUT}$ received from the touch sensitive device 350 into control data (e.g., one or more control signals). The control circuit 314 may use the control data to drive a drive circuit 312 to control a controllably conductive device 310 to adjust the amount of power delivered to the lighting load 304 and/or cause the control data to be transmitted to the lighting load 304 or a central controller of the load control system.

The touch sensitive device 350 may include a capacitive touch circuit 352 and a user interface control circuit 354 (e.g., which may be an example of the capacitive touch controller 252). The capacitive touch circuit 352 that comprises one more capacitive touch elements. For example, the capacitive touch circuit 352 may comprise one or more capacitive touch pads, such as the receiving capacitive touch pads 244 mounted to the capacitive touch PCB 240 of the control device 200. In addition, the capacitive touch circuit 352 may comprise one or more capacitive transmission traces, such as the first and second transmission traces 246, 248 on the capacitive touch PCB 240 of the control device 200. The capacitive touch circuit 352 may provide one or more capacitive receive signals $V_{RX-A}$-$V_{RX-E}$ from the capacitive touch pads of the capacitive touch circuit 352 (e.g., from regions A-E of the receiving capacitive touch pads 242 mounted to the capacitive touch PCB 240 of the control device 200), where each capacitive receive signal $V_{RX-A}$-$V_{RX-E}$ indicates the capacitance of a capacitive touch pad.

The user interface control circuit 354 may include one or more of a processor (e.g., a microprocessor), a microcontroller, a programmable logic device (PLD), a field programmable gate array (FPGA), an application specific integrated circuit (ASIC), or any suitable controller or processing device. The user interface control circuit 354 may include a memory and/or may use the memory 318. The user interface control circuit 354 may be configured to determine or detect a change in the capacitances of the capacitive touch pads of the capacitive touch circuit 352 (e.g., due to a user's finger actuating the front surface 214 of the actuation member 210), and generate the output signal $V_{OUT}$ in accordance with the change in capacitance of the capacitive touch pads. The output signal $V_{OUT}$ may indicate a position of a touch actuation along the front surface of the actuation member (e.g., over the light bar 220). As noted above, the user interface control circuit 354 may receive one or more capacitive receive signals $V_{RX-A}$-$V_{RX-E}$ from the capacitive touch pads of the capacitive touch circuit 352 (e.g., from regions A-E of the receiving capacitive touch pads 242 mounted to the capacitive touch PCB 240 of the control device 200), where each capacitive receive signal $V_{RX-A}$-$V_{RX-E}$ indicates the capacitance of a capacitive touch pad.

The user interface control circuit 354 may be configured to determine the position of the touch actuation along the front surface of the actuation member (e.g., along the light bar 220) in response to the receive signals $V_{RX-A}$-$V_{RX-E}$ generated by the receiving capacitive touch pads. In response, the user interface control circuit 354 may generate and provide the output signal $V_{OUT}$ to the dimmer control circuit 314. For example, the user interface control circuit 354 may be configured to charge capacitances of the capacitive touch pads of the capacitive touch circuit 352. For example, although not illustrated, the capacitive touch pads of the capacitive touch circuit 352 may be coupled to user interface control circuit 354 via a capacitive transmitting circuit (not shown) and/or a capacitive receiving circuit (not shown). The user interface control circuit 354 may be configured to control the capacitive transmitting circuit to charge capacitances of the capacitive touch pads (e.g., the capacitive touch pads 242) of the capacitive touch circuit 352. For example, the capacitive transmitting circuit may be configured to pull the transmission trace (e.g., the transmission trace 244) of the capacitive touch circuit 352 up towards the supply voltage $V_{CC}$ to charge the capacitances of the capacitive touch pads.

The user interface control circuit 354 may step through each of the capacitive touch pads of the capacitive touch circuit 352 and process the capacitive receive signals $V_{RX-A}$-$V_{RX-E}$ to detect a change in the capacitance of the respective capacitive touch pad. For example, the user interface control circuit 354 may periodically charge the capacitance of each of the capacitive touch pads of the capacitive touch circuit 352 and then discharge the capacitance of the respective touch pad into a capacitor (not shown) of the user interface control circuit 354 (e.g., which may have a much larger capacitance than the capacitance of each of the capacitive touch pads of the capacitive touch circuit 352). The user interface control circuit 354 may be configured to compare the voltage across the capacitor of the touch sensitive device 350 to a voltage threshold $V_{TH}$ and generate an output signal $V_{OUT}$, which may indicate when the voltage across the capacitor of the touch sensitive device 350 exceeds the voltage threshold $V_{TH}$. For example, the user interface control circuit 354 may charge and discharge the capacitance of each capacitive touch pad a predetermined number of time (e.g., 500 times) during a sensing interval (e.g., 500 μsec) before moving on the next capacitive touch pad of the capacitive touch circuit 352.

The user interface control circuit 354 may be configured to determine a count $N_{CAP}$ that indicates how many times the capacitance of the respective capacitive touch pad was charged and discharged before the voltage across the capacitor of the touch sensitive device 350 exceeds the voltage threshold $V_{TH}$. The count $N_{CAP}$ may indicate the present capacitance of the respective capacitive touch pad of the capacitive touch circuit 352. The count $N_{CAP}$ for each of the capacitive touch pads of the capacitive touch circuit 352 may represent a sample of the present capacitance of the respective touch pad during the preceding sensing interval. The user interface control circuit 354 may be configured to process the count $N_{CAP}$ to determine the present capacitance of the respective touch pad of the capacitive touch circuit 352 using a respective baseline count $N_{BL}$ for each of the capacitive touch pads of the capacitive touch circuit 352. The baseline count $N_{BL}$ may indicate an idle capacitance of each of the capacitive touch pads when the front surface of the actuation member (e.g., the light bar) is not being actuated. The user interface control circuit 354 may be configured to determine the respective baseline counts $N_{BL}$ for each of the capacitive touch pads of the capacitive touch circuit 352 when the front surface of the actuation member is not being actuated. For example, the baseline count $N_{BL}$ may be a long-term average of the count $N_{CAP}$ determined by the user interface control circuit 354 from the capacitive receive signals $V_{RX-A}$-$V_{RX-E}$.

After stepping through each of the capacitive touch pads of the capacitive touch circuit 352 (e.g., after a round of capacitive sensing of the capacitive touch pads), the user interface control circuit 354 may process the determined counts $N_{CAP}$ for each of the respective capacitive touch pads of the capacitive touch circuit 352 to detect a touch actuation. The user interface control circuit 354 may be configured to determine a change $\Delta_{CAP}$ in the count (e.g., which may indicate the capacitance of each of the capacitive touch pad of the capacitive touch circuit 352) by determining the difference between the respective baseline count $N_{BL}$ from the present count $N_{CAP}$ of the respective capacitive touch pad, e.g., $\Delta_{CAP}=|N_{CAP}-N_{BL}|$. The user interface control circuit 354 may be configured to determine that capacitive sensitive surface (e.g., the light bar) is being actuated when at least one of the changes $\Delta_{CAP}$ in count exceeds a capacitance-change threshold $TH_{CAP}$, which may represent a 0.5% to 1% change in the capacitance, for example.

The user interface control circuit 354 may be configured to determine a number $N_{TOUCH-IN}$ of times (e.g., a number of consecutive rounds of capacitive sensing) that the change $\Delta_{CAP}$ in count for one of the capacitive touch pads exceeds the capacitance-change threshold $TH_{CAP}$. The user interface control circuit 354 may be configured to enter an active touch mode when the number $N_{TOUCH-IN}$ exceeds a touch-in threshold $TH_{TOUCH-IN}$ (e.g., such as two, three, four, five, six, seven, or eight). For example, the user interface control circuit 354 may detect a touch actuation when the number $N_{TOUCH-IN}$ exceeds a touch-in threshold $TH_{TOUCH-IN}$. When in the active touch mode, the user interface control circuit 354 may be configured to determine a number $N_{TOUCH-OUT}$ of times (e.g., a number of consecutive rounds of capacitive sensing) that the change $\Delta_{CAP}$ in count for one of the capacitive touch pads does not exceed the capacitance-change threshold $TH_{CAP}$. The user interface control circuit 354 may be configured to exit the active touch mode when the number $N_{TOUCH-OUT}$ exceeds a touch-out threshold $TH_{TOUCH-OUT}$.

While in the active touch mode, the user interface control circuit 354 may be configured to determine the position of the touch actuation along the touch sensitive surface (e.g., the light bar) in response to ratios of the changes $\Delta_{CAP}$ in the count for each of the capacitive touch pads of the capacitive touch circuit 352 (e.g., in response to the receive signals $V_{RX-A}$-$V_{RX-E}$ generated by the receiving capacitive touch pads). For example, the ratio of the change $\Delta_{CAP}$ in the count for region B to the change $\Delta_{CAP}$ in the count for region C of the receiving capacitive touch pads 244 of the control device 200 may indicate a position of a touch actuation along the light bar 220 between the regions B and C.

The user interface control circuit 354 may provide an output signal $V_{OUT}$ to the dimmer control circuit 314 in response to detecting a touch actuation along the touch sensitive surface of the control device 300 (e.g., in response to detecting a touch actuation along the light bar 220). The output signal $V_{OUT}$ may indicate a position of the touch along the front surface of the actuation member. The dimmer control circuit 314 may be configured to translate the output signal $V_{OUT}$ into control data (e.g., one or more control signals) for controlling one or more electrical loads. For example, the dimmer control circuit 314 may use the control data to drive a drive circuit 312 to control a controllably conductive device 310 to adjust the amount of power delivered to the lighting load 304 and/or may cause the control data to be transmitted to the lighting load 304, another load control device, and/or a system controller of the load control system via a communication circuit 322.

The user interface control circuit 354 may generate a touch actuation signal $V_{ACT}$ that may indicate that a touch is present along the touch sensitive surface of the actuation member of the control device. The user interface control circuit 354 may provide the touch actuation signal $V_{ACT}$ to the dimmer control circuit 314. For example, the user interface control circuit 354 may drive the touch actuation signal $V_{ACT}$ high upon detecting a touch actuation along the touch sensitive surface to indicate that the control device is operating in active touch mode, and otherwise drive the touch activation signal $V_{ACT}$ low.

Although described with reference to the user interface control circuit 354, it should be appreciate that in some examples the control device 300 may include a single control circuit, such as the dimmer control circuit 314, and the processing performed by the user interface control circuit 354 may be performed by the dimmer control circuit 314.

The control device 300 may comprise a wireless communication circuit 322. The wireless communication circuit 322 may include for example, a radio-frequency (RF) transceiver coupled to an antenna for transmitting and/or receiving RF signals. The wireless communication circuit 322 may also include an RF transmitter for transmitting RF signals, an RF receiver for receiving RF signals, or an infrared (IR) transmitter and/or receiver for transmitting and/or receiving IR signals. The wireless communication circuit 322 may be configured to transmit a control signal that includes the control data (e.g., a digital message) generated by the control circuit 314 to the lighting load 304. As described herein, the control data may be generated in response to a user input (e.g., a point actuation or a gesture) to adjust one or more operational aspects of the lighting load 304. The control data may include a command and/or identification information (e.g., such as a unique identifier) associated with the control device 300. In addition to or in lieu of transmitting the control signal to the lighting load 304, the wireless communication circuit 322 may be controlled to transmit the control signal to a central controller of the lighting control system.

The control device 300 may comprise one or more visible indicators 360 (e.g., LEDs). The control circuit 314 may be configured to illuminate visible indicators 360 (e.g., LEDs) to provide feedback of a status of the lighting load 304, to indicate a status of the control device 300, and/or to assist with a control operation (e.g., to provide a color gradient for controlling the color of the lighting load 304, to present backlit virtual buttons for preset, zone, or operational mode selection, etc.). The visible indicators 360 may be configured to illuminate a light bar (e.g., the light bar 220) and/or to serve as indicators of various conditions.

Further, in some examples, the control device 300 may be an accessory control device. In such examples, the control device 300 may not include a controllably conductive device 310 or a drive circuit 312. As such, when the control device 300 does not include the controllably conductive device 310 and the drive circuit 312, the control device 300 may transmit a control signal that includes the control data (e.g., a digital message) generated by the dimmer control circuit 314 to an external device, such as a main dimmer, a system controller, or directly to the lighting load 304. For example, the control device 300 may transmit the digital message wirelessly or via wired communication. The control device 300 may generate the digital message in response to touch actuations (e.g., point actuations or gestures) to adjust one or more operational aspects of the lighting load 304. In some examples, when operating as an accessory device, the control device 300 may be used with a dimmer switch that is replacing a light switch in a 3-way or 4-way lighting circuit. The accessory device may comprise an accessory communication circuit configured to communicate with the dimmer switch over the existing AC mains wiring in the 3-way or 4-way lighting circuits.

Figure 17:
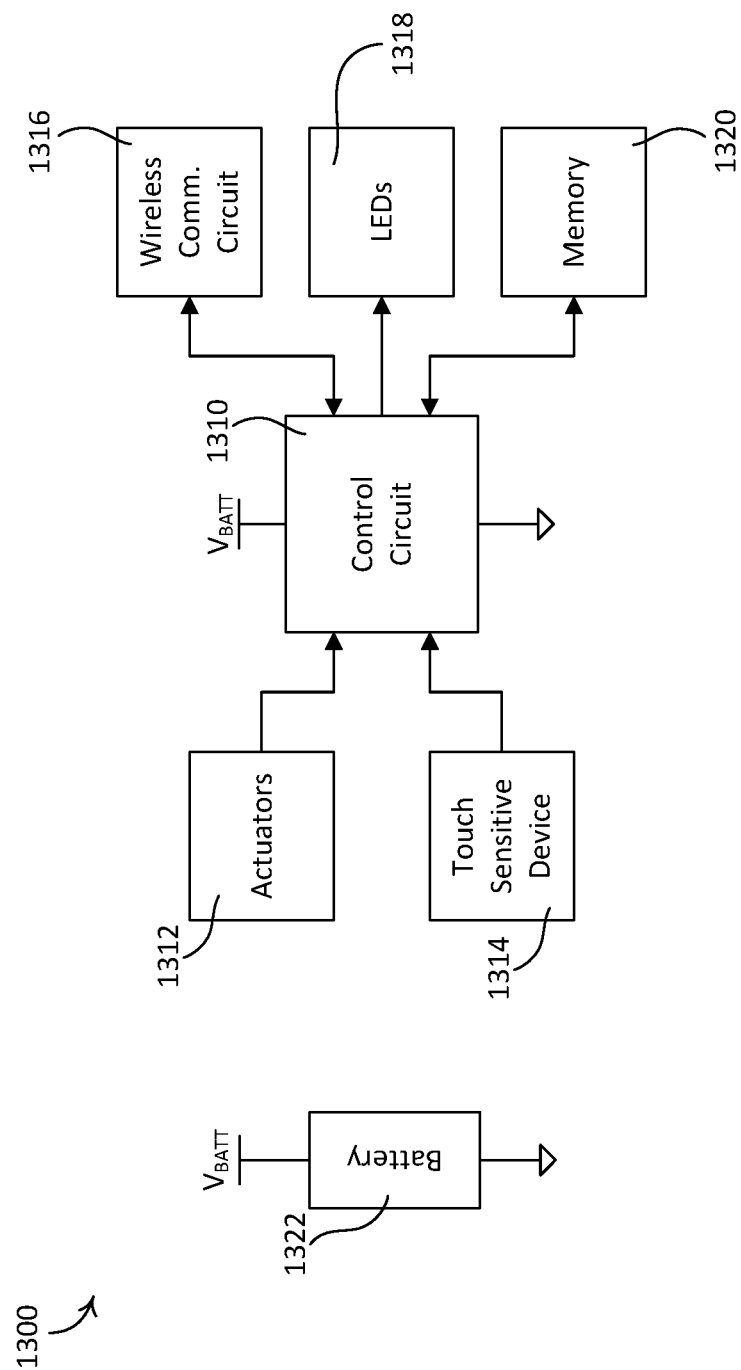
FIG. 17 is a block diagram of an example control device that may be deployed as a remote control device of the load control system of FIG. 1.

FIG. 17 is a block diagram of an example control device 1300 (e.g., a remote control device), which may be deployed as the remote control device 1200 of FIGS. 8-13 and/or the remote control device 600. Further, it should be appreciate that the control device 1300 may be deployed as the remote control device 112, the wall-mounted remote control device 114, the tabletop remote control device 116, and/or the handheld remote control device 118 of the lighting control system 100 of FIG. 1. The control device 1300 may include a control circuit 1310, one or more actuators 1312 (e.g., buttons and/or switches), a touch sensitive device 1314, a wireless communication circuit 1316, one or more LEDs 1318, a memory 1320, and/or a battery 1322. The memory 1320 may be configured to store one or more operating parameters (e.g., such as a preconfigured color scene or a preset light intensity level) of the control device 1300. The battery 1322 may provide power to one or more of the components shown in FIG. 17.

The actuators 1312 (e.g., a mechanical tactile switches) that may be actuated in response to a tactile actuation of one or more respective buttons of the control device (e.g., the actuation member 1232 of the remote control device 1200). The actuators 1312 may be configured to send respective input signals to the control circuit 1310 in response to actuations of the buttons. The touch sensitive device 1314 may be an example of the touch sensitive device 350, and as such, the touch sensitive device 1314 may perform one or more of the functions described with references to the touch sensitive device 350. Further, the control circuit 1310 may perform one or more of the functions described with reference to the dimmer control circuit 314 (e.g., with the exclusion of controlling a drive circuit or performing zero-cross detection). For example, the control circuit 1310 transmits the output level from the touch sensitive device 1314 via the wireless communication circuit for controlling an external load. That is, the control device 1300 may not comprise an internal load control device, but the control circuit 1310 may be configured to transmit (e.g., wirelessly transmit) message (e.g., digital messages) for controlling one or more electrical loads in response to tactile and/or touch actuations of the actuation member.

The touch sensitive device 1314 may include a capacitive or resistive touch element arranged behind, for example, the actuation member 1232 of the remote control device 1200. The touch sensitive device 1314 may be responsive to a touch actuation of, for example, the touch sensitive surface the actuation member 1232. The touch sensitive device 1314 may be configured to detect touch actuations, such as point actuations and/or gestures (e.g., the gestures may be effectuated with or without physical contacts with the touch sensitive device 1314) and provide respective output signals (e.g., such as the output signal $V_{OUT}$) to the control circuit 1310 indicating the detection (e.g., indicating a position of the touch actuation along the touch sensitive surface of the actuation member 1232).

The control circuit 1310 may be configured to translate the input signals provided by the actuators 1312 and/or the output signals provided by the touch sensitive device 1314 into control data (e.g., digital control signals) for controlling one or more electrical loads. The control circuit 1310 may cause the control data (e.g., digital control signals) to be transmitted to the electrical loads via the wireless communication circuit 1316, where for example, the digital signals indicate the output level (e.g., intensity) of the electrical load. For example, the wireless communication circuit 1316 may transmit a control signal including the control data to the one or more electrical loads or to a central controller of the concerned load control system. The control circuit 1310 may control the LEDs 1318 to illuminate a visual indicator (e.g., the light bar 1239 of the remote control device 1200) to provide feedback about various conditions, such as the feedback of the lighting load(s).

It should be appreciated that the example remote control device 1200 illustrated and described herein may provide a simple retrofit solution for an existing switched control system and may ease the installation of a load control system or enhance an existing load control system installation. A load control system that integrates one or more remote control devices 1200 may provide energy savings and/or advanced control features, for example without requiring any electrical re-wiring and/or without requiring the replacement of any existing mechanical switches.

Figure 18:
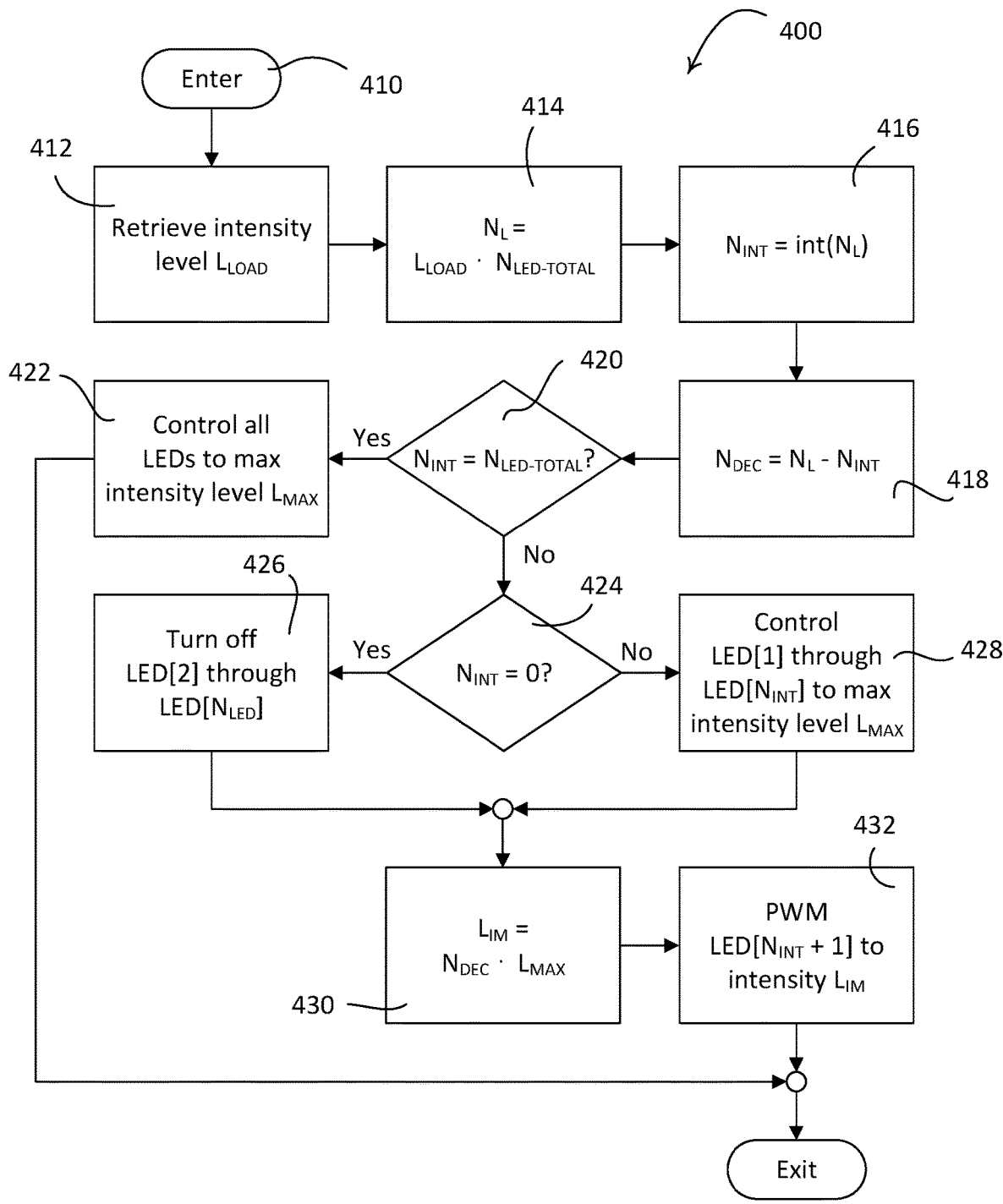
FIG. 18 is a flowchart of an example feedback procedure that may be executed by a control circuit of a control device to illuminate a light bar in an active state.

FIG. 18 is a flowchart of an example feedback procedure 400 that may be executed by a control circuit of a control device (e.g., the control circuit 314 of the control device 300) to illuminate a visible indicator, such as a light bar (e.g., the light bar 220 of the control device 200). For example, the control circuit may be configured to control one or more LEDs (e.g., the LEDs 240 and/or the visible indicators 360) to illuminate the light bar to indicate an intensity level $L_{LOAD}$ of an electrical load (e.g., a lighting load) being controlled by the control device. For example, the control circuit may execute the feedback procedure 400 periodically (e.g., every 20 milliseconds) at 410 while operating the light bar in an active state (e.g., while a touch sensitive surface is being actuated).

At 412, the control circuit may retrieve the intensity level $L_{LOAD}$ of the lighting load. For example, the control circuit may retrieve the intensity level $L_{LOAD}$ from memory (e.g., the memory 318) at 412. In addition, the control circuit may determine the intensity level $L_{LOAD}$ in response to an actuation of an actuator and/or a touch sensitive surface at 412. For example, as a user slides a finger up and the down the light bar, the control circuit may update the intensity level $L_{LOAD}$ and the indication of the intensity level $L_{LOAD}$ provided on the light bar as the feedback procedure 400 is periodically executed. Further, the control circuit may receive the intensity level $L_{LOAD}$ in a message received via a communication circuit (e.g., the wireless communication circuit 322) at 412. At 414, the control circuit may set a number $N_L$ of LEDs that are to be on (e.g., an LED-on number) in dependence upon the intensity level $L_{LOAD}$ and a total number $N_{LED-TOTAL}$ of LEDs, e.g., $N_L = L_{LOAD} \cdot N_{LED-TOTAL}$. For example, when the intensity level $L_{LOAD}$ is 50% and the total number $N_{LED-TOTAL}$ of LEDs is 9, the LED-on number $N_L$ may be 4.5, and when the intensity level $L_{LOAD}$ is 10% and the total number $N_{LED-TOTAL}$ of LEDs is 9, the LED-on number $N_L$ may be 0.9. At 416, the control circuit may set an integer value $N_{INT}$ equal to the integer part of the LED-on number $N_L$. For example, when the LED-on number $N_L$ is 4.5, the integer value $N_{INT}$ may be 4, and when the LED-on number $N_L$ is 0.9, the integer value $N_{INT}$ may be 0. At 418, the control circuit may set a decimal value $N_{DEC}$ equal to the decimal part of the LED-on number $N_L$, e.g., $N_{DEC}=N_L-N_{INT}$. For example, when the LED-on number $N_L$ is 4.5, the decimal value $N_{DEC}$ may be 0.5, and when the LED-on number $N_L$ is 0.9, the decimal value $N_{DEC}$ may be 0.9.

If the integer value $N_{INT}$ is equal to the total number $N_{LED-TOTAL}$ of LEDs at 420, the control circuit may turn on all of the LEDs to the maximum intensity level $L_{MAX}$ (e.g., 100%) at 422, and the feedback procedure 400 may exit. If the integer value $N_{INT}$ is not equal to the total number $N_{LED-TOTAL}$ of LEDs at 420, but is equal to zero at 424, the control circuit may turn off LED[2] through LED[$N_{LED-TOTAL}$] at 426. For example, when there are nine LEDs, the control circuit may turn off $LED_2$-$LED_9$ (e.g., the LEDs 2-9 as shown in FIG. 5) at 426. If the integer value $N_{INT}$ is not equal to zero at 424, the control circuit may control LED[1] through LED[$N_{INT}$] to the maximum intensity level $L_{MAX}$ (e.g., 100%) at 428. For example, when the LED-on number $N_L$ is 4.5, the control circuit may control $LED_1$-$LED_4$ (e.g., the LEDs 1-4 as shown in FIG. 5) to the maximum intensity level $L_{MAX}$ at 428. At 430, the control circuit may set the intermediate intensity level $L_{IM}$ for the intermediate LED of the illuminated LEDs in dependence upon the decimal value $N_{DEC}$ and the maximum intensity level $L_{MAX}$ using a linear relationship, e.g., $L_{IM}=N_{DEC} \cdot L_{MAX}$. In addition, the intermediate intensity level $L_{IM}$ for the intermediate LED of the illuminated LEDs may be determined based on a non-linear relationship between the decimal value $N_{DEC}$ and the maximum intensity level $L_{MAX}$. Further, the intermediate intensity level $L_{IM}$ may be determined from a look-up table, for example, using the decimal value $N_{DEC}$ (e.g., $L_{IM}=N_{DEC}*L_{MAX}$) or using a formula (e.g., square law), for example, to create a non-linear rise. In the example described herein, the intermediate LED may be LED[1] when the intensity level $L_{LOAD}$ is 10% and LED[5] when the intensity level $L_{LOAD}$ is 50%. At 432, the control circuit may control the intensity level of LED[$N_{INT}+1$] (e.g., the intermediate LED) to the intermediate intensity $L_{IM}$ (e.g., by pulse-width modulating the intermediate LED), and the procedure 400 may exit.

Figure 19:
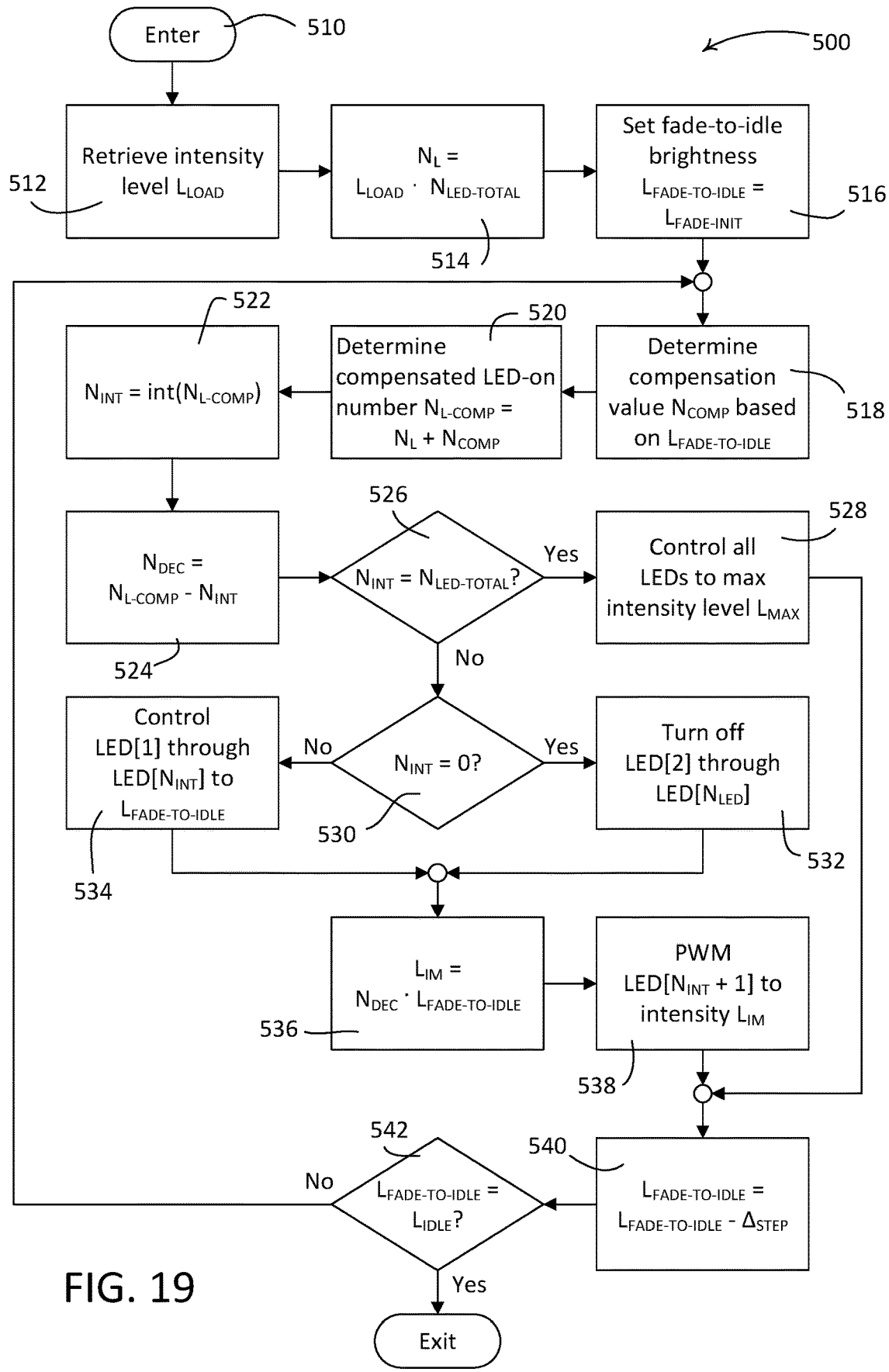
FIG. 19 is a flowchart of an example feedback procedure that may be executed by a control circuit of a control device to illuminate a light bar while transitioning from an active state to an idle state.

FIG. 19 is a flowchart of an example feedback procedure 500 that may be executed by a control circuit of a control device (e.g., the control circuit 314 of the control device 300) to illuminate a visible indicator, such as a light bar (e.g., the light bar 220 of the control device 200). For example, the control circuit may be configured to control one or more LEDs (e.g., the LEDs 240 and/or the visible indicators 360) to illuminate the light bar to indicate an intensity level $L_{LOAD}$ of an electrical load (e.g., a lighting load) being controlled by the control device. The control circuit may execute the feedback procedure 500 while transitioning the light bar from an active state to an idle state (e.g., as described herein). For example, the control circuit may execute the feedback procedure 500 at 510 in response to detecting the end of an actuation of a touch sensitive surface.

At 512, the control circuit may retrieve the intensity level $L_{LOAD}$ of the lighting load. For example, the control circuit may retrieve the intensity level $L_{LOAD}$ from memory (e.g., the memory 318) at 512. In addition, the control circuit may determine the intensity level $L_{LOAD}$ in response to an actuation of an actuator and/or a touch sensitive surface at 512. Further, the control circuit may receive the intensity level $L_{LOAD}$ in a message received via a communication circuit (e.g., the wireless communication circuit 322) at 512. At 514, the control circuit may set a number $N_L$ of LEDs that are to be on (e.g., an LED-on number) in dependence upon the intensity level $L_{LOAD}$ and a total number $N_{LED-TOTAL}$ of LEDs, e.g., $N_L=L_{LOAD} \cdot N_{LED-TOTAL}$. For example, when the intensity level $L_{LOAD}$ is 50% and the total number $N_{LED-TOTAL}$ of LEDs is 9, the LED-on number $N_L$ may be 4.5, and when the intensity level $L_{LOAD}$ is 10% and the total number $N_{LED-TOTAL}$ of LEDs is 9, the LED-on number $N_L$ may be 0.9. At 516, the control circuit may set a fade-to-idle brightness $L_{FADE-TO-IDLE}$ to an initial fade-to-idle brightness $L_{FADE-INIT}$ (e.g., 100%). The control circuit may use the fade-to-idle brightness $L_{FADE-TO-IDLE}$ to determine an overall intensity level of the light bar while transitioning from the active state to the idle state. For example, the fade-to-idle brightness $L_{FADE-TO-IDLE}$ may decrease while the control circuit is transitioning from the active state to the idle state. In some examples, the fade-to-idle brightness $L_{FADE-TO-IDLE}$ may be in the range of 0.0 to 1.0.

At 518, the control circuit may determine a compensation value $N_{COMP}$ based on the fade-to-idle brightness $L_{FADE-TO-IDLE}$. The compensation value $N_{COMP}$ may be used to ensure that the intermediate LED does not appear to be reducing in intensity at a rate that is greater than (or less than) the LED[1] through LED[$N_{INT}$]. In some example, the compensation value $N_{COMP}$ may correspond to an additional amount or number of LEDs to be illuminated in response to decreased fade-to-idle brightness $L_{FADE-TO-IDLE}$ so that the light bar may still indicate the intensity level $L_{LOAD}$ of the lighting load even though the light bar is illuminated dimly. For example, the control circuit may determine the compensation value $N_{COMP}$ as a function (e.g., an exponential function) of the fade-to-idle brightness $L_{FADE-TO-IDLE}$, e.g., $N_{COMP}=5^{-x}-0.2$, where $x=L_{FADE-TO-IDLE}$. As such, the compensation value $N_{COMP}$ may increase in value as the fade-to-idle brightness $L_{FADE-TO-IDLE}$ decreases.

At 520, the control circuit may determine a compensated LED-on number $N_{L-COMP}$ based on the LED-on number $N_L$ and the compensation value $N_{COMP}$, e.g., $N_{L-COMP}=N_L \cdot N_{COMP}$. For example, if $N_L$ has a value of 4.5, and $N_{COMP}$ has a value of 0.6, then $N_{L-COMP}$ may have a value of 5.1. At 522, the control circuit may set an integer value $N_{INT}$ equal to the integer part of the compensated LED-on number $N_{L-COMP}$. For example, the integer value $N_{INT}$ may be equal to 5 (e.g., increase from 4 to 5). At 524, the control circuit may set a decimal value $N_{DEC}$ equal to the decimal part of the compensated LED-on number $N_{L-COMP}$, e.g., $N_{DEC}=N_{L-COMP}-N_{INT}$. For example, the decimal part $N_{DEC}$ may be equal to 0.1. As such, in this example, the compensation value $N_{COMP}$ may result in an additional LED being illuminated as the visible indicator is transitioning from the active state to the idle state, although it should be appreciated that the compensation value $N_{COMP}$ will not always have that affect.

If the integer value $N_{INT}$ is equal to the total number $N_{LED-TOTAL}$ of LEDs at 526, the control circuit may turn on all of the LEDs to the fade-to-idle brightness $L_{FADE-TO-IDLE}$ at 528, and the feedback procedure 500 may exit. If the integer value $N_{INT}$ is not equal to the total number $N_{LED-TOTAL}$ of LEDs at 526, but is equal to zero at 530, the control circuit may turn off LED[2] through LED[$N_{LED-TOTAL}$] at 532. If the integer value $N_{INT}$ is not equal to zero at 530, the control circuit may control LED[I] through LED[$N_{INT}$] to the fade-to-idle brightness $L_{FADE-TO-IDLE}$ at 534. At 536, the control circuit may set the intermediate intensity level $L_{IM}$ for the intermediate LED (e.g., LED[$N_{INT}+1$]) of the illuminated LEDs in dependence upon the decimal value $N_{DEC}$ and the fade-to-idle brightness $L_{FADE-TO-IDLE}$ using linear relationship, e.g., $L_{IM}=N_{DEC} \cdot L_{FADE-TO-IDLE}$. In addition, the intermediate intensity level $L_{IM}$ for the intermediate LED of the illuminated LEDs may be determined based on a non-linear relationship between the decimal value $N_{DEC}$ and the fade-to-idle brightness $L_{FADE-TO-IDLE}$. Further, the intermediate intensity level $L_{IM}$ may be determined from a look-up table, for example, using the decimal value $N_{DEC}$ or using a formula (e.g., square law), for example, to create a non-linear rise. For example, the intermediate intensity level $L_{IM}$ may be set as $L_{IM}=N_{DEC}*L_{FADE-TO-IDLE}$, where $N_{DEC}=N_{DEC}^X$, where "X" may be a number between 1 (no effect) and 2 (square law), for example.

At 538, the control circuit may control the intensity level of LED[$N_{INT}+1$] (e.g., the intermediate LED) to the intermediate intensity $L_{IM}$ (e.g., by pulse-width modulating the intermediate LED). At 540, the control circuit may decrease the fade-to-idle brightness $L_{FADE-TO-IDLE}$ by a step value $\Delta_{STEP}$ (e.g., 1%), e.g., $L_{FADE-TO-IDLE}=L_{FADE-TO-IDLE}-\Delta_{STEP}$. If the fade-to-idle brightness $L_{FADE-TO-IDLE}$ is not equal to an idle state intensity level $L_{IDLE}$ (e.g., 20%) at 542, the feedback procedure 500 may loop around to update the intensity levels of all of the LEDs at the new fade-to-idle brightness $L_{FADE-TO-IDLE}$. If the fade-to-idle brightness $L_{FADE-TO-IDLE}$ is equal to the idle state intensity level $L_{IDLE}$ at 542, the feedback procedure 500 may exit.

While the light bar 220 is described herein as a linear (e.g., straight) light bar provided on the control device 200 (e.g., a wall-mounted dimmer switch), the light bar 220 may be provided in other configurations and/or on other types of control devices, such as a light bar that is at last partially curved (e.g., the light bar 620 of the control device 600).

What is claimed is:

1. A control device for controlling an electrical load, the control device comprising:
   a front surface configured to detect a user input to adjust an amount of power delivered to the electrical load;
   a plurality of light sources;
   a continuous light bar provided on the front surface and configured to be illuminated by the plurality of light sources to indicate the amount of power delivered to the electrical load; and a control circuit configured, based on the amount of power delivered to the electrical load, to: determine to illuminate a first subset of the plurality of light sources at a first intensity level to illuminate a first portion of the continuous light bar, wherein the first intensity level is a maximum intensity level;
   determine to illuminate an intermediate light source of the plurality of light sources at one of a plurality of second intensity levels to illuminate a second portion of the continuous light bar, wherein the second intensity levels are between a minimum intensity level that is greater than zero and the maximum intensity level, and wherein the control circuit is configured to determine the second intensity level based on the amount of power delivered to the electrical load;
   determine not to illuminate a second subset of the plurality of light sources; and
   illuminate the first subset of the plurality of light sources at the first intensity level and the intermediate light source at the second intensity level to provide illumination of the first portion and the second portion of the continuous light bar,
   wherein the intermediate light source is located between the first subset of the plurality of light sources and the second subset of the plurality of light sources, and wherein the second portion of the continuous light bar is located between the first portion and the third portion of the continuous light bar.

2. The control device of claim 1, wherein at least a portion of the continuous light bar is curved.

3. The control device of claim 1, wherein the continuous light bar is a circular light bar.

4. The control device of claim 1, wherein the continuous light bar is a linear light bar.

5. The control device of claim 1, wherein the control device comprises a diffuser configured to scatter light received from the plurality of light sources to the continuous light bar, and wherein the plurality of light sources comprises one or more light-emitting diodes.

6. The control device of claim 1, wherein the control circuit is configured to:
   determine the first subset of the plurality of light sources to be illuminated at the first intensity level and the intermediate light source to be illuminated at the intermediate intensity level based on the amount of power delivered to the electrical load and a total number of the plurality of light sources.

7. The control device of claim 1, wherein the control circuit is configured to illuminate the intermediate light source at the intermediate intensity level using a pulse-width modulation technique.

8. The control device of claim 1, wherein the control circuit is configured to illuminate the continuous light bar in an active state and an idle state, the control circuit further configured to decrease at least the first intensity level when the control circuit is transitioning from the active state to the idle state.

9. The control device of claim 8, wherein the control circuit is further configured to illuminate the second subset of the plurality of light sources as the first intensity level is decreased when the control circuit is transitioning from the active state to the idle state.

10. The control device of claim 1, wherein the user input comprises an actuation action applied to the front surface or a gesture provided in a proximity of the front surface.

11. The control device of claim 1, further comprising:
    an actuation member that defines the front surface, the front surface comprising a touch sensitive surface that is configured to detect a user input; and
    a touch sensitive device configured to detect a touch actuation along a touch sensitive surface of the actuation member and generate an output signal that indicates a position of the touch actuation along the touch sensitive surface;
    wherein the control circuit is configured to determine the amount of power delivered to the electrical load based on the output signal.

12. The control device of claim 11, wherein the touch sensitive surface comprises a capacitive touch surface.

13. A control device for controlling a lighting load in a load control system, the control device comprising:
    a printed circuit board;
    a plurality of light sources mounted to the printed circuit board;
    a diffuser arranged at a front surface of the control device to form a light bar and configured to receive light emitted by the plurality of light sources and scatter the light within the diffuser; and
    a control circuit configured to control the plurality of light sources to illuminate a portion of the light bar to indicate an intensity level of the lighting load;

wherein the control circuit is configured to illuminate a set of adjacent light sources determined based on the intensity level of the lighting load to a maximum intensity level, and to illuminate an end light source next to the set of adjacent light sources to an intermediate intensity level that ranges across a plurality of intensity values between a minimum intensity level and the maximum intensity level based on the intensity level of the lighting load to provide continuous illumination on the light bar.

14. The control device of claim 13, wherein the diffuser is configured to provide an elongated continuous light bar at the front surface of the control device.

15. The control device of claim 14, further comprising:
an actuation member defining the front surface of the control device;
wherein the diffuser is configured to extend through an opening in the actuation member to provide the light bar.

16. The control device of claim 13, wherein the light bar is linear.

17. The control device of claim 13, wherein the light bar is circular.

18. The control device of claim 13, further comprising:
a load control circuit configured to control power delivered to an electrical load.

19. The control device of claim 13, further comprising:
a light pipe configured to conduct light emitted by the plurality of light sources to a front surface of the control device.

20. The control device of claim 13, wherein the control circuit is configured to determine the intermediate intensity level based on and a total number of the plurality of light sources.

21. The control device of claim 13, wherein the control circuit is configured to not illuminate at least one of the plurality of light sources that is adjacent to the end light source based on the intensity level of the lighting load.

22. The control device of claim 13, wherein the end light source is located between the set of adjacent light sources that are illuminated to the maximum intensity level and at least one light source that off.

23. A control device for controlling an electrical load, the control device comprising:
a front surface configured to detect a user input to adjust an amount of power delivered to the electrical load;
a plurality of light sources;
a continuous light bar provided on the front surface and configured to be illuminated by the plurality of light sources to indicate the amount of power delivered to the electrical load; and a control circuit configured to:
determine the amount of power delivered to the electrical load;
determine, based on the amount of power delivered to the electrical load, a first subset of the plurality of light sources to be illuminated at a first intensity level, an intermediate light source, an intermediate intensity level to illuminate the intermediate light source, and a second subset of the plurality of light sources to be not illuminated, wherein the intermediate light source is located between the first subset of the plurality of light sources and the second subset of the plurality of light sources, wherein the intermediate intensity level is less than the first intensity level, and wherein the second intensity level is adjustable across a plurality of intensity values between a minimum intensity level and the maximum intensity level based on the amount of power delivered to the electrical load; and
illuminate the first subset of the plurality of light sources at the first intensity level and the intermediate light source at the intermediate to provide continuous on the continuous light bar.

* * * * *